(12) United States Patent
Jain et al.

(10) Patent No.: US 10,468,374 B2
(45) Date of Patent: Nov. 5, 2019

(54) DIE INTERCONNECT SUBSTRATES, A SEMICONDUCTOR DEVICE AND A METHOD FOR FORMING A DIE INTERCONNECT SUBSTRATE

(71) Applicant: Intel Corporation, Santa Clara, CA (US)

(72) Inventors: Rahul Jain, Chandler, AZ (US); Ji Yong Park, Chandler, AZ (US); Kyu Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/475,175

(22) Filed: Mar. 31, 2017

(65) Prior Publication Data

US 2018/0286812 A1 Oct. 4, 2018

(51) Int. Cl.
*H01L 23/538* (2006.01)
*H01L 23/00* (2006.01)
*H01L 25/00* (2006.01)
*H01L 25/065* (2006.01)

(52) U.S. Cl.
CPC .......... *H01L 24/81* (2013.01); *H01L 23/5385* (2013.01); *H01L 24/17* (2013.01); *H01L 25/0652* (2013.01); *H01L 25/50* (2013.01); *H01L 23/5383* (2013.01); *H01L 23/5384* (2013.01); *H01L 2224/16113* (2013.01); *H01L 2224/16235* (2013.01)

(58) Field of Classification Search
CPC ............. H01L 23/5381; H01L 23/5383; H01L 23/5385; H01L 23/5386; H01L 24/17; H01L 24/181; H01L 25/0655; H01L 25/50
See application file for complete search history.

(56) References Cited

U.S. PATENT DOCUMENTS

| 8,227,904 | B2 | 7/2012 | Braunisch |
| 9,147,663 | B2 | 9/2015 | Liu |
| 2016/0141234 | A1* | 5/2016 | We ...................... H01L 23/5385 361/767 |

* cited by examiner

*Primary Examiner* — Cuong Q Nguyen
(74) *Attorney, Agent, or Firm* — Schwabe, Williamson & Wyatt, P.C.

(57) ABSTRACT

Examples relate to a die interconnect substrate comprising a bridge die comprising at least one bridge interconnect connecting a first bridge die pad of the bridge die to a second bridge die pad of the bridge die. The die interconnect substrate further comprises a substrate structure comprising a substrate interconnect electrically insulated from the bridge die, wherein the bridge die is embedded in the substrate structure. The die interconnect substrate further comprises a first interface structure for attaching a semiconductor die to the substrate structure, wherein the first interface structure is connected to the first bridge die pad. The die interconnect substrate further comprises a second interface structure for attaching a semiconductor die to the substrate structure, wherein the second interface structure is connected to the substrate interconnect. A surface of the first interface structure and a surface of the second interface structure are at the same height.

22 Claims, 17 Drawing Sheets

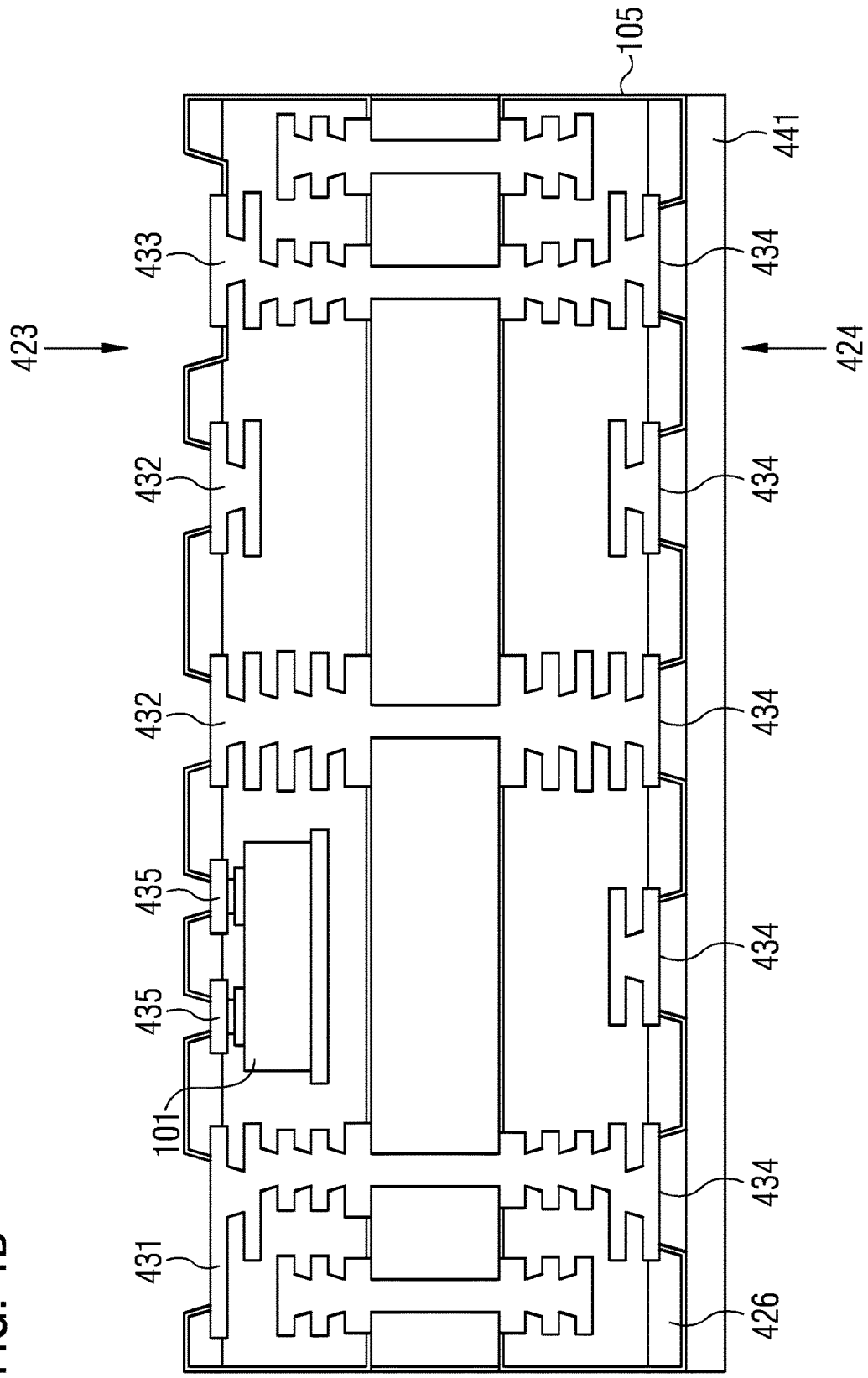

DIE INTERCONNECT SUBSTRATES, A SEMICONDUCTOR DEVICE AND A METHOD FOR FORMING A DIE INTERCONNECT SUBSTRATE

TECHNICAL FIELD

Examples relate to concepts for die interconnects, and in particular to die interconnect substrates, a semiconductor device and a method for forming a die interconnect substrate.

BACKGROUND

Semiconductor devices can include semiconductor dies, which are attached or connected to other circuits or substrates via solder structures. Variations in the solder structures (e.g. bump top variations) can lead to unreliable or faulty electrical signals being provided to or from the semiconductor die.

BRIEF DESCRIPTION OF THE FIGURES

Some examples of apparatuses and/or methods will be described in the following by way of example only, and with reference to the accompanying figures, in which

FIGS. 4A to 4L show schematic illustrations of a method for forming a die interconnect substrate;

DETAILED DESCRIPTION

Figure 1A:
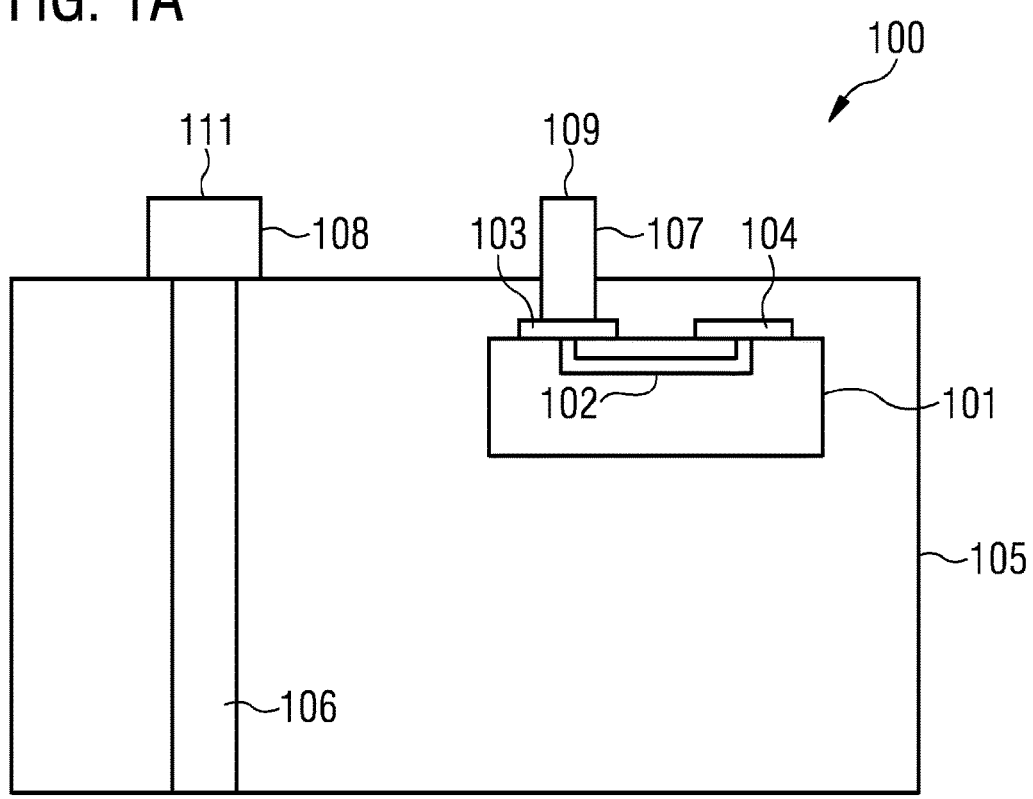
FIG. 1A shows a schematic illustration of a die interconnect substrate.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Electrical components or devices may be embedded in packages to provide protection against impact and corrosion, to hold the contact pins or leads and/or to dissipate heat produced by the device, for example. A semiconductor package may include one or more semiconductor components. Individual components may be formed in a silicon wafer before being cut and assembled in a package. A semiconductor package may have only few leads or contacts for devices such as diodes, or may have hundreds of contact interfaces (e.g. pads, solder balls or solder bumps) in case of a microprocessor, for example. In addition to providing connections to the semiconductor die and handling waste heat, the semiconductor package may protect the semiconductor die against the ingress of moisture, for example. Similarly, non-semiconductor electrical components (e.g. resistors, capacitors, inductors) may be arranged in packages.

FIG. 1A shows a schematic illustration of a side view of a die interconnect substrate 100.

The die interconnect substrate 100 comprises a bridge die 101 comprising at least one bridge interconnect 102 connecting a first bridge die pad 103 of the bridge die 101 to a second bridge die pad 104 of the bridge die 101.

The die interconnect substrate 100 further comprises a substrate structure 105 comprising a substrate interconnect 106 electrically insulated from the bridge die 101. The bridge die 101 is embedded in the substrate structure 105.

The die interconnect substrate 100 further comprises a first interface structure 107 for attaching a semiconductor die to the substrate structure 105. The first interface structure 107 is connected to the first bridge die pad 103.

The die interconnect substrate 100 further comprises a second interface structure 108 for attaching a semiconductor die to the substrate structure 105. The second interface structure 108 is connected to the substrate interconnect 106.

A surface 109 of the first interface structure 107 and a surface 111 of the second interface structure 108 are at the same height.

Due to the surface 109 of the first interface structure 107 and the surface 111 of the second interface structure 108 being at the same height, connections to the die interconnect substrate 100 (e.g. a connection between a semiconductor die and the die interconnect substrate 100) may be made more reliably. By reducing the gap or the bump height difference between the surface 109 of the first interface structure 107 and the surface 111 of the second interface structure 108 (e.g. by planarization), connections to the first interface structure 107 and the second interface structure 108 may be made more reliably.

The substrate structure 105 may include an electrically insulating substrate and the substrate interconnect 106. The substrate interconnect 106 may be one of a plurality of substrate interconnects 106 of the substrate structure 105. The plurality of substrate interconnects 106 may extend through at least part of the electrically insulating substrate. For example, one or more substrate interconnects 106 of the plurality of substrate interconnects 106 may extend (substantially vertically) through the electrically insulating substrate from a front side of the substrate structure 105 towards (or to) the back side of the substrate structure 105. A portion of each substrate interconnect 106 may lie at a level above the bridge die 101 and a further portion of the substrate interconnect 106 may lie at a level below the bridge die 101. Additionally or optionally, one or more further substrate interconnects 106 of the plurality of substrate interconnects 106 may extend from the front side of the substrate structure towards the back side of the substrate structure 105, but may end before reaching the back side of the substrate structure 105. Additionally or optionally, one or more substrate interconnects 106 of the plurality of substrate interconnects 106 may be ohmically or electrically connected to other substrate interconnects 105 of the substrate structure 105.

Each substrate interconnect 106 may be configured to provide a route for an electrical signal, which may be carried or relayed through the substrate structure 106 by the substrate interconnect 106. Each substrate interconnect 106 may include a plurality of lateral wiring layers and a plurality of vertical wiring layers arranged alternatingly with respect to each other in a substantially vertical direction. The plurality of vertical wiring layers of a substrate interconnect 106 may extend in a substantially vertical direction and may be arranged alternatingly between the plurality of lateral wiring layers of the substrate interconnect 106, for example.

A maximal lateral dimension (e.g. a maximal width) of a vertical wiring layer of the substrate interconnect 106 may be less than 20 µm (or e.g. less than 10 µm, or e.g. less than 5 µm). A (vertical) thickness of a lateral wiring layer of the substrate interconnect 106 may be less than 20 µm (or e.g. less than 10 µm, or e.g. less than 5 µm).

The plurality of lateral wiring layers may extend in a substantially lateral (horizontal) direction. A lateral wiring layer may be formed by forming (e.g. depositing) an electrically conductive layer (e.g. a metal layer, or e.g. a copper layer) on a surface of the electrically insulating substrate. Using a combination of processes a lateral wiring layer may be formed in selected areas of the substrate structure 105 according to the desired or required wiring layout. After forming the lateral wiring layer, an electrically insulating build-up layer of the electrically insulating substrate may be formed on the lateral wiring layer. For example, the build-up layer may be deposited by hot (or vacuum)-lamination. By forming an opening (or via) extending substantially vertically through the electrically insulating build-up layer, and depositing electrically conductive material in the opening, a vertical wiring layer may be formed which contacts or connects to the previous lateral wiring layer. By repeating the processes of forming a lateral wiring layer, forming a build-up layer and forming a vertical wiring layer, a substrate interconnect 106 which extends vertically through at least part of the electrically insulating substrate may be formed.

Lateral wiring layers located at the same lateral level may be formed simultaneously in the same process. Additionally, vertical wiring layers located at the same lateral level may be formed in same process. Depending on the desired wiring layout, a lateral wiring layer of a first substrate interconnect 106 may be ohmically or electrically connected (at the same lateral level) to a lateral wiring layer of a second substrate interconnect (see FIG. 1B). In this way, an electrical signal may be routed between the first substrate interconnect 106 and the second substrate interconnect 106.

The electrically insulating substrate may be a polymer-based, epoxy-based and/or laminate based substrate. Optionally, the electrically insulating substrate may include an electrically insulating core and/or electrically insulating build-up layers.

The (or each) substrate interconnect 106 may be electrically insulated from the bridge die 101 by at least part of the electrically insulating substrate. For example, at least part of the electrically insulating substrate of the substrate structure 106 may be located between the bridge die 101 and the substrate interconnect 106. For example, at least part of the electrically insulating substrate may surround (e.g. laterally surround) the substrate interconnect 106.

Figure 1B:
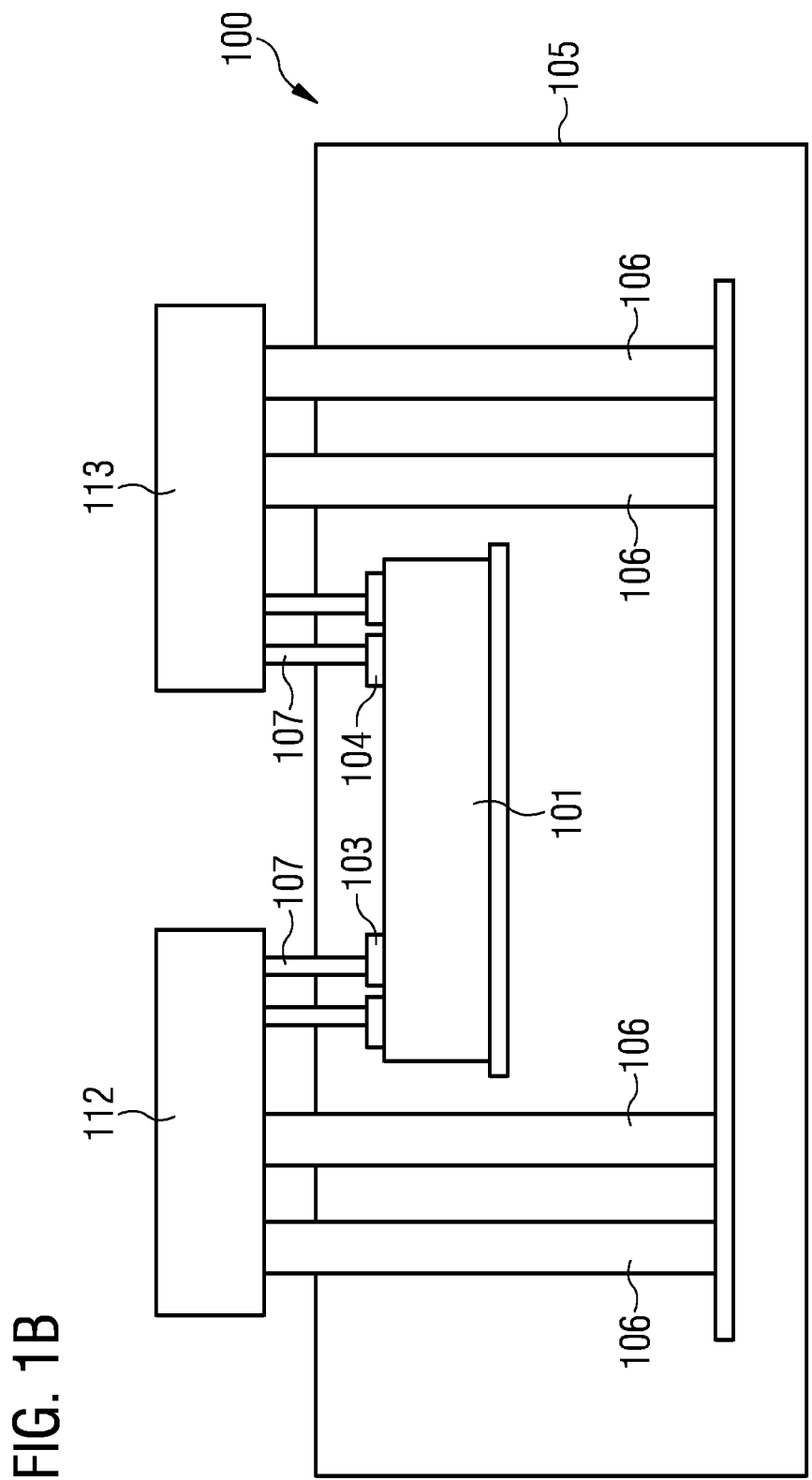
FIG. 1B shows a schematic illustration of a die interconnect substrate attached to at least one semiconductor die.

FIG. 1B shows a schematic illustration of a die interconnect substrate 100 attached to at least one semiconductor die 112, 113. The bridge die 101 may be an embedded multi-die interconnect bridge (EMIB) die. For example, the bridge die 101 may provide one or more electrical interconnections between multiple semiconductor dies (See FIG. 1B). The bridge die 101 may include a plurality of bridge die pads 103, 104 and a plurality of bridge interconnects 102. Additionally or optionally, the first bridge die pad 103 may be one bridge die pad 103 of first group (or plurality) of bridge die pads 103 of all the bridge die pads of the bridge die 101. The first group of bridge die pads 103 may be located within a first lateral region of the bridge die 101. The first group of bridge die pads 103 may each be ohmically or electrically connected to the same (first) semiconductor die 112 via interface structures individually ohmically or electrically connected to each bridge die pad 103 of the first group of bridge die pads 103. The second bridge die pad 104 may be one bridge die pad 104 of second group (or plurality) of bridge die pads 104 of all the bridge die pads of the bridge die 101. The second group of bridge die pads 104 may be located within a second lateral region of the bridge die 101 which is different from the first lateral region of the bridge die 101. The second group of bridge die pads 104 may each be ohmically or electrically connected to the same (second) semiconductor die 113 via interface structures individually connected to each bridge die pad 104 of the second group of bridge die pads 104.

Figure 6:
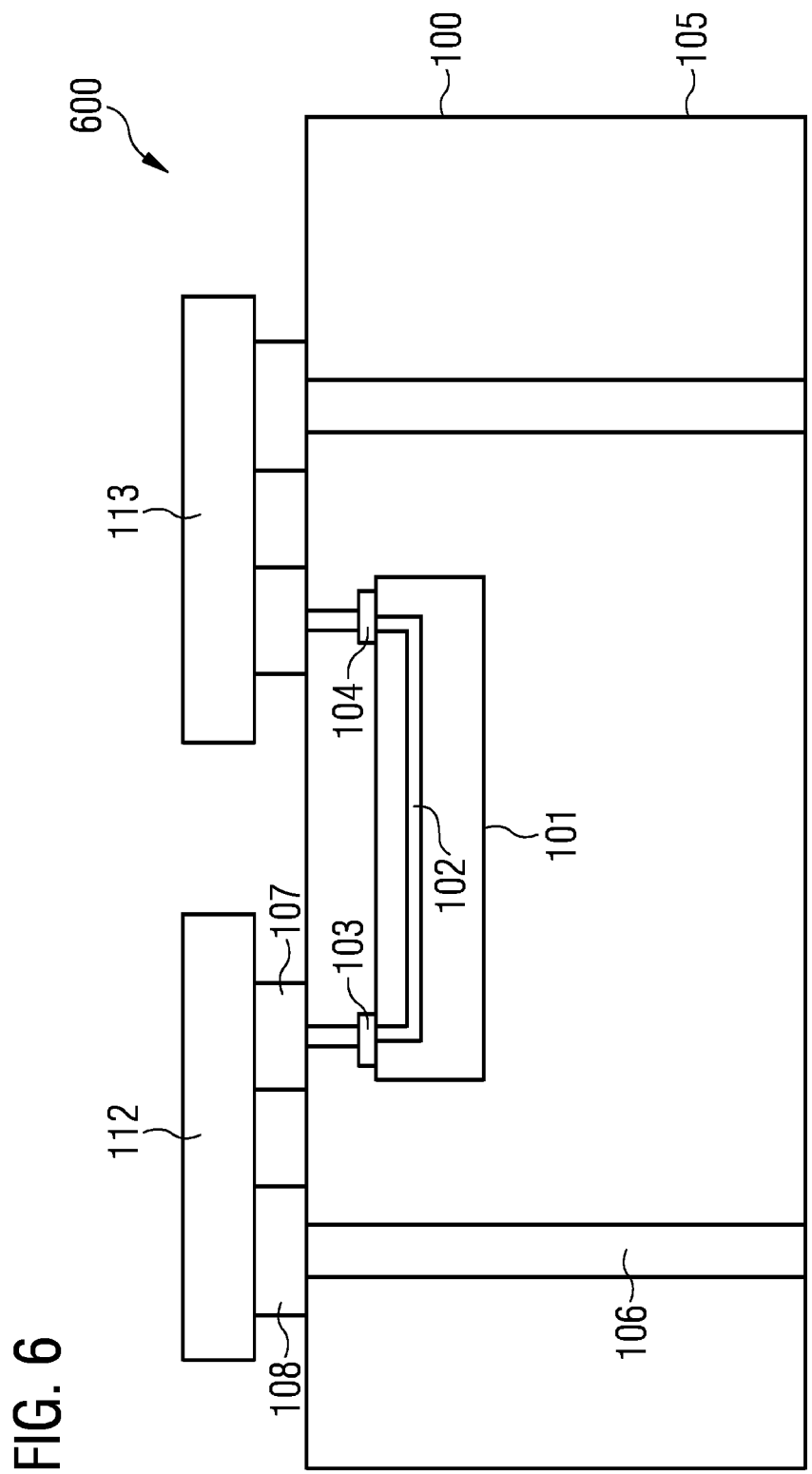
FIG. 6 shows a schematic illustration of a semiconductor device including a die interconnect substrate and at least one semiconductor die.

Each bridge interconnect 102 may provide a route for an electrical signal. As shown in FIGS. 1A and 6, one bridge interconnect 102 may connect a first bridge die pad 103 of the first group of bridge die pads to a second bridge die pad 104 of the second group of bridge die pads. Since the first bridge die pad 103 may be connected to the first semiconductor die 112 via the first interface structure 107, and the second bridge die pad 104 may be connected to a second semiconductor die 113 via the second interface structure 108, the bridge interconnect 102 may provide a route for an electrical signal between the first semiconductor die 112 and the second semiconductor die 113. Additionally or optionally, one or more further bridge interconnects 102 may each be configured to provide an electrical route between another bridge die pad of the first group of bridge die pads to another bridge die pad of the second group of bridge die pads.

Additionally or optionally, at least one other bridge interconnect 102 may be configured to provide a route for an electrical signal from a bridge die pad to a substrate interconnect 106 of the substrate structure 105.

The bridge die 101 may be embedded in the electrically insulating substrate of the substrate structure 105. For example, the bridge die 101 may be located in a cavity of the electrically insulating substrate. As an example, the cavity may be located at the front side of the electrically insulating substrate. At least part of the electrically insulating substrate may be located around the bridge die 101 so that the bridge die may be electrically insulated from the substrate interconnects 106 of the substrate structure 105. At least part of the electrically insulating substrate may be located laterally around the bridge die 101 (e.g. on sidewalls of the bridge die 101) and/or may cover the back side and/or front side of the bridge die 101.

Optionally, the first bridge die pad 103 and the second bridge die pad 104 may be located at a front side of the bridge die 101. Additionally or optionally, the back side of the bridge die 101 may be in contact with an electrically conductive layer which may be located at the bottom of the cavity of the electrically insulating substrate.

The bridge die 101 may include a substrate die, which may be a glass die or a (high resistivity) silicon die. The plurality of bridge interconnects 102 may be routed through at least part of the bridge die 101. For example, a bridge interconnect 102 may include a first vertically extending portion connecting the first die pad 103 to a laterally extending portion of the bridge interconnect 102. The bridge interconnect 102 may further include a second vertically extending portion connecting the laterally extending portion to the second die pad 104. By repeating the processes of forming a lateral extending portion on a surface of the substrate die, depositing an electrically insulating bridge substrate material and forming a vertically extending portion, the plurality of bridge interconnects 102 may be formed. Each bridge interconnect 102 may be electrically insulated from other bridge interconnects 102 by the electrically insulating bridge substrate material located between the bridge interconnects 102. The electrically insulating bridge substrate material may include silicon dioxide, high resistivity silicon or glass, for example. A thickness of the bridge die 101 may be smaller than 200 µm (or smaller than 150 µm or smaller than 100 µm). Optionally, the bridge die 101 may be primarily (or solely) for routing electrical signals. For example, no transistors may be implemented on the bridge die 101 and/or the bridge die 101 may have no electrically active doping regions. For example, the implantation of dopants into the bridge die 101 may be unnecessary, if no transistors and diodes are implemented on the on the bridge die 101.

The die interconnect substrate 100 may further include a plurality of first interface structures 107, which may each be connected to a bridge die pad of the bridge die 101. Optionally, the plurality of first interface structures 107 may each be connected to the bridge die pads of the first group of bridge die pads. The die interconnect substrate may further include a plurality of second interface structures 108, which may each be connected to a substrate interconnect of the substrate structure 105. The plurality of first interface structures 107 and the plurality of second interface structures 108 may be located at the front side of the substrate structure 105. The plurality of first interface structures 107 and the plurality of second interface structures 108 may be copper (Cu)-based interface structures.

Each first (contact) interface structure 107 may be (or may include at least part of) a solder bump structure for providing an ohmic or electrical contact to a semiconductor die. Similarly, each second (contact) interface structure 108 may be (or may include at least part of) a different solder bump structure for providing an ohmic or electrical contact to a semiconductor die. For example, the first interface structure 107 and the second interface structure 108 may each be configured for attaching a semiconductor die to the substrate structure 105 via a controlled collapse chip connection C4 (e.g. a flip chip connection). For example, solder material located on the first interface structure 107 and the second interface structure 108 may be reshaped after planarization and reflow.

Both the first interface structure 107 and the second interface structure 108 may protrude from (or may be exposed at) the front surface of the substrate structure 105. Additionally, the die interconnect substrate may include a surface finish layer which may be located at the lateral surface 109 of the first interface structure 107 and at the lateral surface 111 of the second interface structure 108. Thus, the substrate structure 105 may be attached (or e.g. soldered to) a semiconductor die via the first interface structure 107 and the second interface structure 108. Optionally, the first interface structure 107 and the second interface structure 108 may be attached to the same semiconductor die. However, alternatively, it may be possible that the first interface structure 107 may be attached to a first semiconductor die 112 and the second interface structure 108 may be attached to a second semiconductor die 113 (as shown in FIG. 1B).

Generally, the bump pitch between the plurality of first interface structures 107 may be smaller than the bump pitch between the plurality of second interface structures 108. For example, the minimal distance between adjacent interface structures 107 of the plurality of first interface structures 107 may be smaller than a minimal distance between adjacent interface structures 108 of the plurality of second interface structures 108. For example, the minimal distance between adjacent interface structures 107 of the plurality of first interface structures 107 may be less than 0.7 times (or e.g. less than 0.5 times, or e.g. less than 0.4 times) a minimal distance between adjacent interface structures 108 of the plurality of second interface structures 108. A minimal (or smallest) distance between adjacent interface structures 107 of the plurality of first interface structures 107 may be less than 60 µm (or e.g. less than 50 µm, or e.g. less than 40 µm). A minimal (or smallest) distance between adjacent interface structures 108 of the plurality of second interface structures 108 may be larger than 60 µm (or e.g. larger than 70 µm, or e.g. larger than 80 µm).

A maximal (or largest) lateral dimension (e.g. a width) of the first interface structure 107 may be smaller than the second interface structure 108. For example, a maximal lateral dimension of the second interface structure 108 may be at least 1.5 times (or e.g. 2 times, or e.g. 3 times) a maximal lateral dimension of the first interface structure 107. A maximal lateral dimension of the first interface structure may be less than 30 µm (or e.g. less than 25 µm, or e.g. less than 20 µm). A maximal lateral dimension of the second interface structure may be larger than 50 µm (or e.g. larger than 60 µm, or e.g. larger than 70 µm, or e.g. may lie between 50 µm and 150 µm). The maximal lateral dimension may be a dimension measured at the lateral surfaces 109, 111 of the first interface structure 107 and the second interface structure 108.

A vertical dimension (or bump height) of the first interface structure 107 may lie between 0 μm and 30 μm (or e.g. between 10 μm and 25 μm, or e.g. between 15 μm and 20 μm). For example, the vertical dimension of the first interface structure 107 may be 15 μm. The vertical dimension of the first interface structure 107 may be a (substantially vertical) distance between the lateral surface 109 of the first interface structure 107 and a front surface of the electrically insulating substrate, for example. Additionally or optionally, a (vertical) dimension (or bump height) of the second interface structure 108 may lie between 0 μm and 30 μm (or e.g. between 10 μm and 25 μm, or e.g. between 15 μm and 20 μm, or e.g. 15 μm). The vertical dimension of the second interface structure 108 may be a (substantially vertical) distance between the lateral surface 111 of the second interface structure 108 and the front surface of the electrically insulating substrate, for example. The vertical dimension of the first interface structure 107 may vary from the vertical dimension of the second interface structure 108 by less than 20% (or e.g. less than 10%, or e.g. less than 5%, or e.g. less than 1%) of the vertical dimension of the first interface structure 107.

The surface of the first interface structure 107 and the second interface structure 108 may be at the same height, as understood within the parameters (or limitations) of planarization at the dimensions of the die interconnect substrate. For example, the surface of the first interface structure 107 and the second interface structure 108 being at the same height does not necessarily exclude that a very small (or almost negligible) bump top variation (BTV) may be present between the first interface structure 107 and the second interface structure 108. A bump top variation (BTV) or bump height variation (BHV) may be a variation (e.g. bump height delta, or difference in bump height) in or between the lateral surface levels 109, 111 of the first interface structure 107 and the second interface structure 108. The surface of the first interface structure 107 and the second interface structure 108 being at the same height may mean that the lateral surfaces 109, 111 of the first interface structure 107 and the second interface structure 108 are substantially level with each other. For example, a vertical distance between a surface 109 of the first interface structure 107 and a surface 111 of the second interface structure 108 may be less than 10 μm (or e.g. less than 8 μm or e.g. less than 4 μm. Explained in other words, a vertical distance between a lateral level (or height) of the surface 109 of the first interface structure 107 and a lateral level (or height) of the surface 111 of the second interface structure 108 may be less than 10 μm.

The surfaces 109, 111 of the first interface structure 107 and the second interface structure 108 may be substantially flat. For example, a tilt (or gradient or slope) of the lateral surface 109 of the first interface structure 107 may vary by less than 5° (or e.g. less than 3°, or e.g. less than) 1° over at least 80% (or e.g. at least 85%, or e.g. at least 95%) of the lateral surface 109 of the first interface structure 107. Additionally, a tilt (or gradient or slope) of the lateral surface 109 of the second interface structure 108 may vary by less than 5° (or e.g. less than 3°, or e.g. less than) 1° over at least 80% (or e.g. at least 85%, or e.g. at least 95%) of the lateral surface 111 of the second interface structure 108.

The plurality of first interface structures 107 and the plurality of second interface structures 108 may have different bump pitches. The plurality of first interface structures 107 with smaller bump pitches may tend to have a larger vertical dimension than the plurality of second interface structures with larger bump pitches after electroplating. However, due to planarizing the surface of the substrate structure 105 until the plurality of first interface structures and the plurality of second interface structures are level, an average BTV (or BH delta) of 10 μm or larger than 10 μm may be avoided. Planarizing the surface may include planarizing the plurality of first interface structures 107 until they reach the height of the second interface structure 108. Additionally or optionally, the planarizing of the surface may also include planarizing the plurality of first interface structures 107 and the plurality of second interface structures 108 simultaneously so that the plurality of first interface structures 107 and the plurality of second interface structures 108 have the same height.

A thickness of the substrate structure 105 may be between 50 μm and 1 mm (or e.g. between 100 μm and 700 μm, or e.g. between 150 μm and 500 μm). For example, the thickness of the substrate structure 105 may be a (vertical) distance between a lateral surface of the first interface structure 107 located at the front side of the substrate structure 105 and a lateral surface of a third interface structure located at the back side of the substrate structure 105.

Optionally or additionally, the die interconnect substrate 100 may further include a bridge contact structure located between the first bridge die pad 103 and the first interface structure 107. The bridge contact structure may include a first intermediate layer and a second intermediate layer formed on the first intermediate layer. The first intermediate layer may be an electroless nickel-palladium-gold (NiPdAu) layer and the second intermediate layer may be an electroless copper (Cu) layer. Optionally, the bridge contact structure may be formed on one or more (copper) lateral wiring layers or vertical wiring layers formed on the bridge die pad 103.

Optionally or additionally, the substrate interconnect 106 may include a contact portion. The contact portion of the substrate interconnect 106 and the bridge contact structure may be located at the same wiring layer (same wiring levels) of the substrate structure 105. For example, the contact portion of the substrate interconnect 106 may also include the first intermediate layer and the second intermediate layer formed on the first intermediate layer. Optionally, the contact portion of the substrate interconnect 106 may be connected to one or more (copper) lateral wiring layers or vertical wiring layers of the substrate interconnect 106.

The die interconnect substrate 100 may further include a plurality of third interface structures located at the back surface of the substrate structure 105. The plurality of third interface structures may be for attaching the substrate structure 105 to a carrier (e.g. to a printed circuit board) at the back surface of the substrate structure 105. Optionally, one or more substrate interconnects 106 of the substrate structure 105 may be further connected to the third interface structure. For example, one or more substrate interconnects 106 may each be connected between a second interface structure 108 at the front surface of the substrate structure 105 and the third interface structure at the back surface of the substrate structure.

Additionally, or optionally, the die interconnect substrate 100 may further include a fourth interface structure located at the front surface of the substrate structure 105 for attaching a passive component to the substrate structure 105. Alternatively, the passive component may be a capacitor (e.g. a die side capacitor DSC) or a host fabric interface (HFI). Optionally, the die interconnect substrate 100 may include a fourth interface structure for attaching a DSC to the substrate structure 105, and a fifth interface structure for attaching a HFI to the substrate structure 105. Generally, besides semiconductor dies, one or more other structures may be connected to one or more front side (or back side) contact interface structures. The one or more other structures may be a processor circuit (e.g. central processing unit CPU), a memory circuit, a (wireless or wireline) transmitter circuit and/or a (wireless or wireline) receiver circuit implemented on a semiconductor die.

A lateral surface (e.g. of the bridge die, or a substrate) may be a substantially even plane (e.g. neglecting unevenness of the die due to the manufacturing process and trenches). The lateral surface may be substantially perpendicular (or orthogonal) to a vertical edge of the die. For example, in comparison to a (substantially vertical or orthogonal) edge of the die, the lateral surface may be a basically horizontal surface extending laterally. The lateral dimension of the lateral surface of the die may be more than 100 times larger (or more than 1000 times or more than 10000 times) than a basically vertical dimension (or height) of a vertical edge of the die, for example. A lateral dimension or lateral distance may be a dimension or distance measured in a direction substantially horizontal to the lateral surface of the die.

The die interconnect substrate, the first semiconductor die and the second semiconductor device die may be arranged in a common (e.g. the same) semiconductor package. The components of the electrical device may be embedded in the semiconductor package. For example, the components of the electrical device such as the die interconnect substrate and the semiconductor devices may be partially or fully surrounded by a package material. The package material may be an epoxy, a plastic and/or a mold compound, for example. Optionally, the carrier structure may be a package substrate of the common semiconductor package.

A plurality of back side (third) contact interface structures of the die interconnect substrate may be located at the back side of the die interconnect substrate for connecting the electrical device (and/or the semiconductor package) to an external carrier structure (e.g. to a printed circuit board PCB), for example. The plurality of back side contact interface structures may be connected to the plurality of substrate interconnects of the multilayer substrate structure, for example. The plurality of back side contact interface structures may be solder bumps (e.g. ball grid array bumps). The die interconnect substrate of the semiconductor package may be connected to the external carrier structure. The carrier structure may be an organic substrate (e.g. package carrier substrate or printed circuit board PCB). The carrier structure may be soldered to (e.g. all back side contact interface structure of) the plurality of back side contact interface structures forming solder connections between the carrier structure and the die interconnect substrate.

Figure 2:
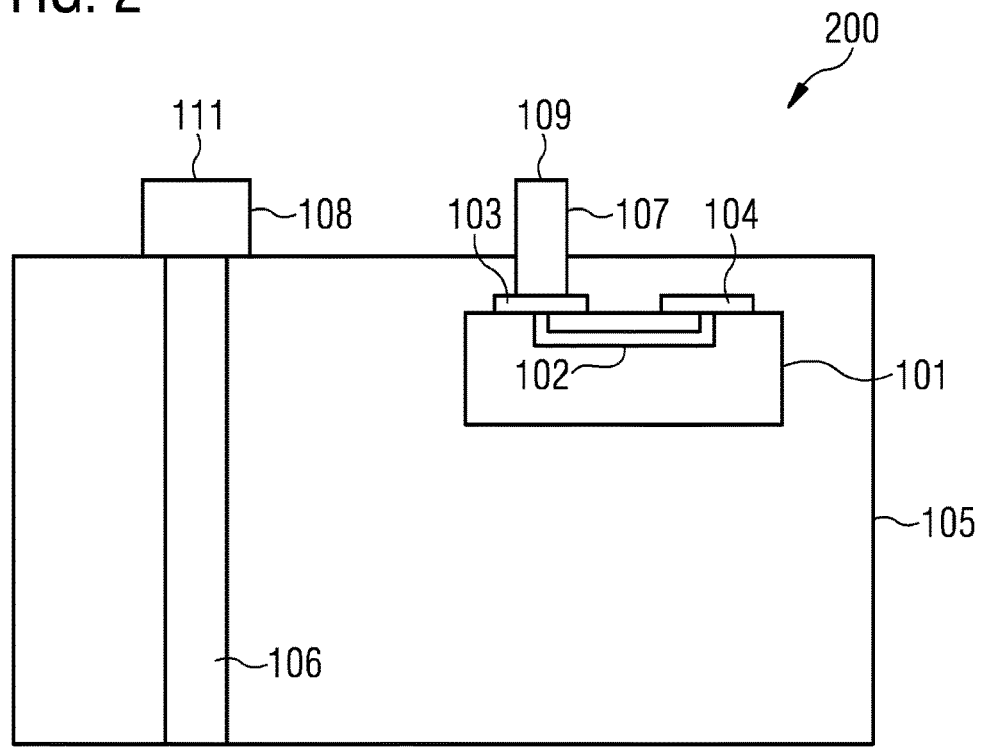
FIG. 2 shows a schematic illustration of a further die interconnect substrate.

FIG. 2 shows a schematic illustration of a side view of the die interconnect substrate 200.

The die interconnect substrate 200 comprises a bridge die 101 comprising at least one bridge interconnect 102 connecting a first bridge die pad 103 of the bridge die 101 to a second bridge die pad 104 of the bridge die 101.

The die interconnect substrate 200 further comprises a substrate structure 105 comprising a substrate interconnect 106 electrically insulated from the bridge die 101. The bridge die 101 is embedded in the substrate structure 105.

The die interconnect substrate 200 further comprises a first interface structure 107 for attaching a semiconductor die to the substrate structure 105. The first interface structure 107 is connected to the first bridge die pad 103.

The die interconnect substrate 200 further comprises a second interface structure 108 for attaching a semiconductor die to the substrate structure 105. The second interface structure 108 is connected to the substrate interconnect 106.

A tilt of the lateral surface 109 of the first interface structure 107 varies by less than 5° over at least 80% of the lateral surface 111 of the first interface structure 107.

Due to the tilt of the lateral surface 109 of the first interface structure 107 varying by less than 5° over at least 80% of the lateral surface 111 of the first interface structure 107, connections to the die interconnect substrate (e.g. a connection between a semiconductor die and the die interconnect substrate) may be made more reliably, for example. For example, faulty connections caused by bump top variations, BTV may be reduced.

The tilt (or gradient or slope) of the lateral surface 109 of the first interface structure 107 may vary by less than 5° (or e.g. less than 3°, or e.g. less than) 1° over at least 80% (or e.g. at least 85%, or e.g. at least 95%) of the lateral surface 109 of the first interface structure 107. Additionally, a tilt (or gradient or slope) of the lateral surface 109 of the second interface structure 108 may vary by less than 5° (or e.g. less than 3°, or e.g. less than) 1° over at least 80% (or e.g. at least 85%, or e.g. at least 95%) of the lateral surface 111 of the second interface structure 108.

More details and aspects are mentioned in connection with the examples described above or below. The examples shown in FIG. 2 may comprise one or more optional additional features corresponding to one or more aspects mentioned in connection with the proposed concept or one or more examples described above (e.g. FIGS. 1A to 1B) or below (FIGS. 3 to 6).

Figure 3:
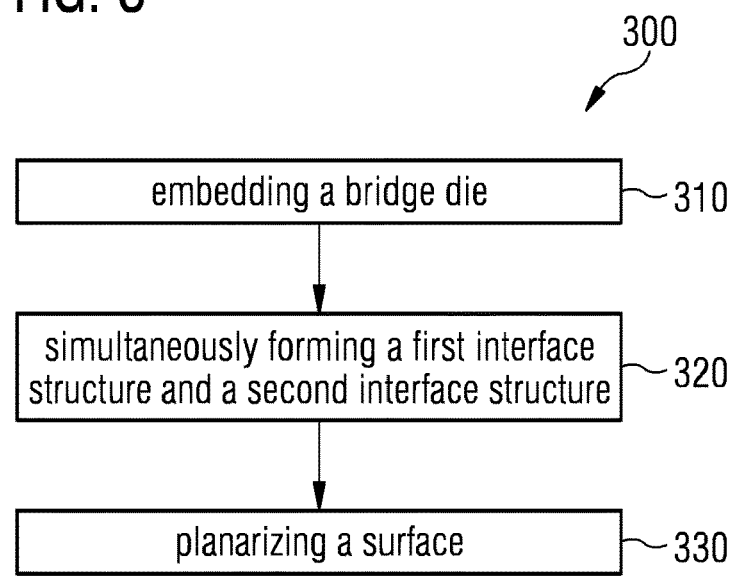
FIG. 3 shows a flow chart of a method for forming a die interconnect substrate.

FIG. 3 shows a flow chart of a method 300 for forming a die interconnect substrate.

The method 300 comprises embedding (310) a bridge die in a substrate structure. The bridge die comprises at least one bridge interconnect connecting a first bridge die pad of the bridge die to a second bridge die pad of the bridge die. The substrate structure comprises a substrate interconnect electrically insulated from the bridge die.

The method 300 further comprises simultaneously forming (320) a first interface structure and a second interface structure. The first interface structure is connected to the first bridge die pad, and the second interface structure is connected to the substrate interconnect.

The method 300 further comprises planarizing (330) a surface until a surface of the first interface structure and a surface of the second interface structure are at the same height.

Due to the planarizing of the surface, connections to the die interconnect substrate (e.g. a connection between a semiconductor die and the die interconnect substrate) may be made more reliably, for example. For example, faulty connections caused by bump top variations, BTV may be reduced.

To embed the bridge die in the substrate structure, the method may include placing or arranging a bridge die in a cavity of an electrically insulating substrate of the substrate structure. Even before placing or arranging the bridge die in the cavity, the substrate structure may include a plurality of substrate interconnects (or portions of the substrate interconnects) which may be electrically insulated from the bridge die. The substrate interconnects may have been formed by using a combination of processes (e.g. patterning process). For example, a lateral wiring layer of a substrate interconnect may be formed in a selected area of the substrate structure according to the desired or required wiring layout. After forming the lateral wiring layer, an electrically insulating build-up layer of the electrically insulating substrate may be formed on the lateral wiring layer. For example, the build-up layer may be deposited by vacuum-lamination. By forming an opening or via (e.g. by laser drilling) extending substantially vertically through the electrically insulating build-up layer, and depositing electrically conductive material in the opening, a vertical wiring layer may be formed which contacts or connects to the previous lateral wiring layer below. By repeating the processes of forming a lateral wiring layer, forming a build-up layer and forming a vertical wiring layer, a substrate interconnect which extends vertically through at least part of the electrically insulating substrate may be formed.

Additionally or optionally, the at least one first interface structure and at least one second interface structure may be formed by electroplating copper, for example. Due to the difference in widths of the openings in which the electrolytic copper bumps are formed, the height of the at least one first interface structure may be different from the at least one second interface structure. By planarizing the surface, at least one of the first interface structure 107 and second interface structure 108 may be planarized (e.g. by chemical mechanical polishing) until their lateral surfaces are substantially level.

More details and aspects are mentioned in connection with the examples described above or below. The examples shown in FIG. 3 may comprise one or more optional additional features corresponding to one or more aspects mentioned in connection with the proposed concept or one or more examples described above (e.g. FIGS. 1 to 2) or below (FIGS. 4A to 6).

FIGS. 4A to 4L show more details of the method for forming a die interconnect substrate.

Figure 4A:
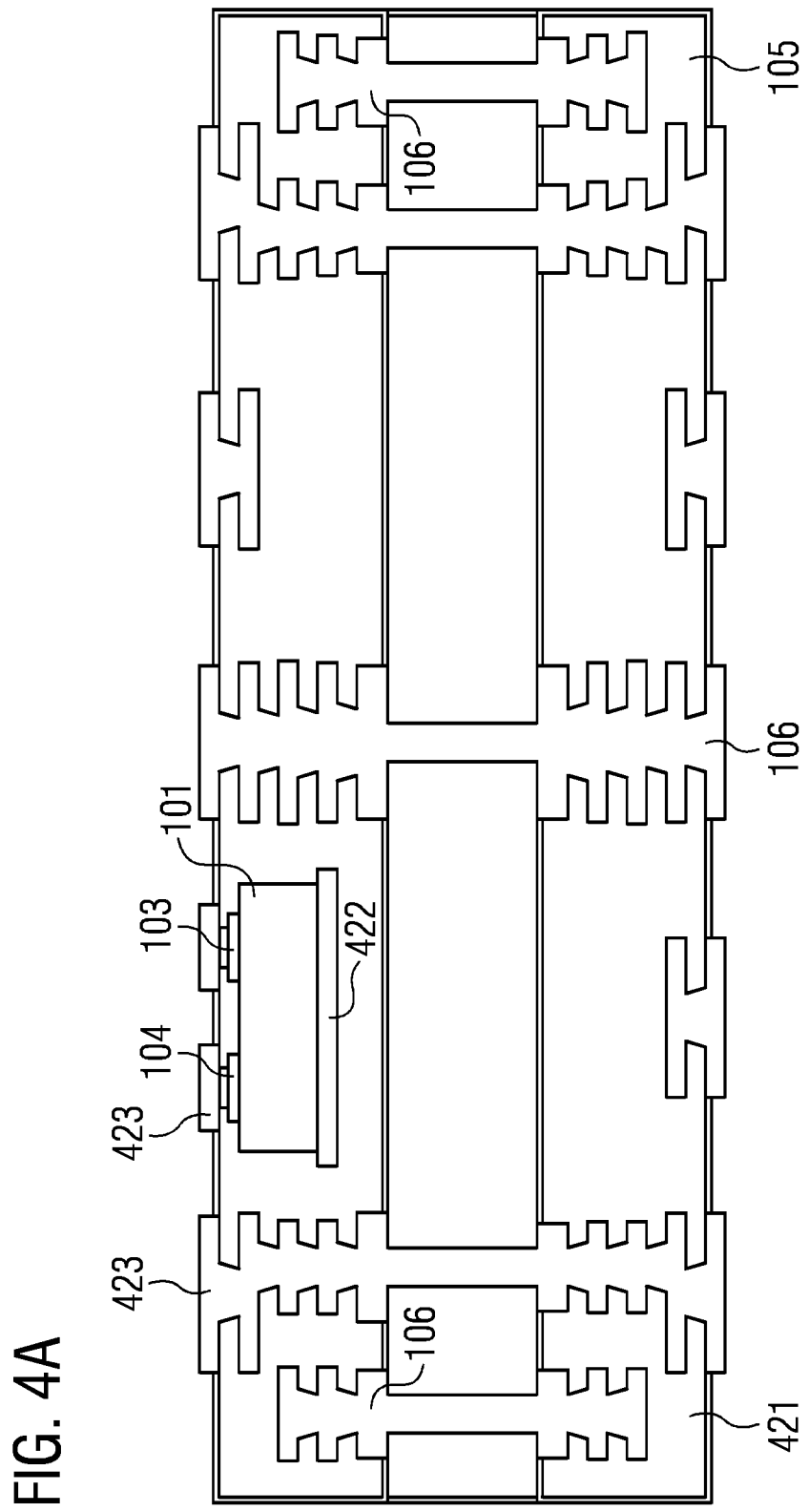

FIG. 4A shows the substrate build up to the final build-up layer, for example. As shown in FIG. 4A, the method may include embedding a bridge die 101 in a substrate structure 105. For example, the method may include placing or arranging a bridge die 101 in a cavity of an electrically insulating substrate 421 of the substrate structure 105.

The bridge die 101 may include a first bridge die pad 103 and a second bridge die pad 104. The substrate structure 105 may further include an electrically conductive layer 422 which may be located at the bottom of the cavity of the electrically insulating substrate 421.

The method may further include forming (or depositing) a build-up layer of the electrically insulating substrate to cover or embed the bridge die 101. The build-up layers may be formed by vacuum-lamination, for example. After embedding the bridge die 101, the method may further include selectively removing portions of the build-up layer to create openings in the build-up layer. The openings may expose portions of the substrate interconnect and the bridge die pads 103, 104. The method may further include forming at least one wiring layer 423 by depositing electrically conductive material in the openings of the build-up layer. By alternating between forming build-up layers and depositing electrically conductive material, one or more wiring layers of the substrate interconnect 106 and one or more wiring layers located on the first bridge die pad 103 and the second bridge die pad 104 may be formed. The one or more wiring layers may be electrically insulated from each other by portions of the build-up layer.

Figure 4B:
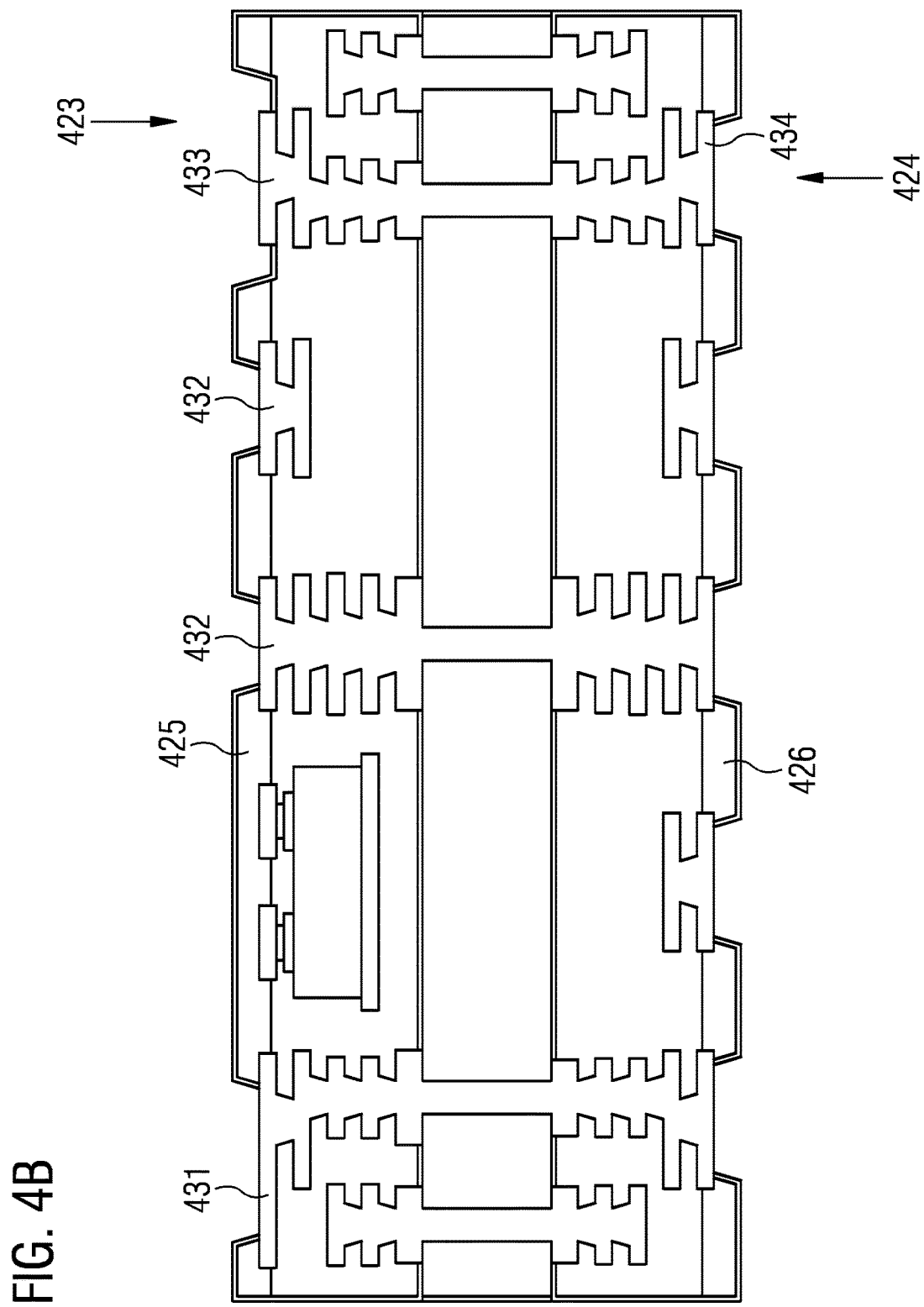

As shown in FIG. 4B, the method may include forming a first mask layer 425 on the front side 423 of the substrate structure 105 and a second mask layer 426 at the back side 424 of the substrate structure 105. The mask layer may be a solder resist lamination layer. After depositing the solder resist lamination layer, the patterning of pads (e.g. C4 pads, HFI pads, DSC pads and SLI pads may be carried out. For example, the method may include removing a plurality of portions of the first mask layer 425 to form a plurality of first openings in the first mask layer 425. The first openings in the first mask layer 425 may expose a plurality of substrate interconnects 106 at the front side 423 of the substrate structure 105. The method may further include removing at least one portion of the second mask layer 426 to form at least one second opening in the second mask layer 426. The second openings in the second mask layer 426 may expose a plurality of substrate interconnects 106 at the back side 424 of the substrate structure 105. An exposed portion 432 of a first substrate interconnect may eventually (later) be connected to a semiconductor die via an interface structure suitable for a C4 connection. Additionally or optionally, an exposed portion 431 of a second substrate interconnect may eventually be connected to a DSC via an interface structure. Additionally or optionally, an exposed portion 433 of a third substrate interconnect may eventually be connected to a HFI via an interface structure. Additionally or optionally, an exposed portion 434 of at least one substrate interconnect at the back side 424 of the substrate structure 105 may be connected to a second level interconnect (SLI) via an interface structure. A width (or maximal lateral dimension) of the exposed portions 431,433, 434 of the substrate interconnects may be larger than 50 µm (or e.g. larger than 60 µm, or e.g. larger than 70 µm). A width (or maximal lateral dimension) of the exposed portion 432 of the substrate interconnects may be less than 50 µm (or e.g. less than 40 µm, or e.g. less than 30 µm).

Figure 4C:
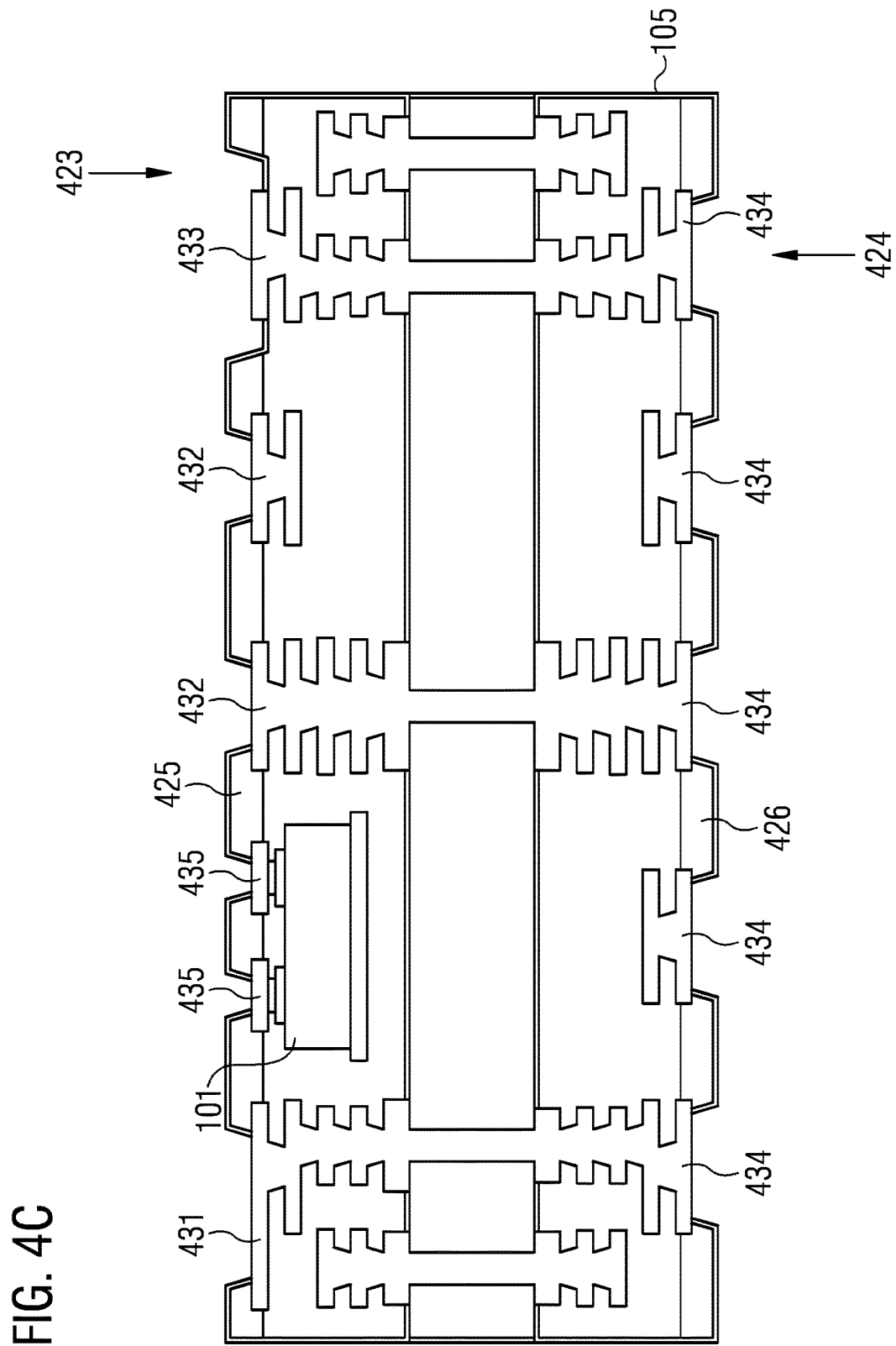

As shown in FIG. 4C, the method may further include removing a plurality of portions of the first mask layer 425 to from a plurality of third openings in the first mask layer 425. The plurality of third openings may expose wiring layers located on the bridge die pads of the bridge die 101, for example. In the process, small solder resists openings may be formed in the solder resist lamination layer using a laser process (e.g. an ultra violet laser process). Removing the plurality of portions of the first mask layer 425 may cause openings to be formed on wiring layers located on the first bridge die pad 103 and the second bridge die pad 104. A width (or maximal lateral dimension) of the exposed portions 435 of the wiring layers located on the first bridge die pad 103 and the second bridge die pad may be less than 0.8 times (or e.g. less than 0.5 times, or e.g. less than 0.3 times) a width (or maximal lateral dimension) of the first and second openings of the substrate interconnects.

As shown in FIG. 4D, the method may further include forming a protection layer 441 on the back side 424 of the substrate structure 105 after forming the first openings, the second openings and the third openings. The protection layer 441 may cover the back side 424 (e.g. all of the back side) of the substrate structure 105. The method may further include using a roughening process to roughen the front side 423 of the substrate structure 105 after forming the protection layer 441 on the back side 424 of the substrate structure 105. The roughening process may include using etching (e.g. plasma etching and/or chemical etching) to roughen the front side 423 of the substrate structure. Due to the protection layer 441 covering the back side 424 of the substrate structure 105, the back side 424 of the substrate structure 105 may be protected from the roughening process.

Figure 4E:
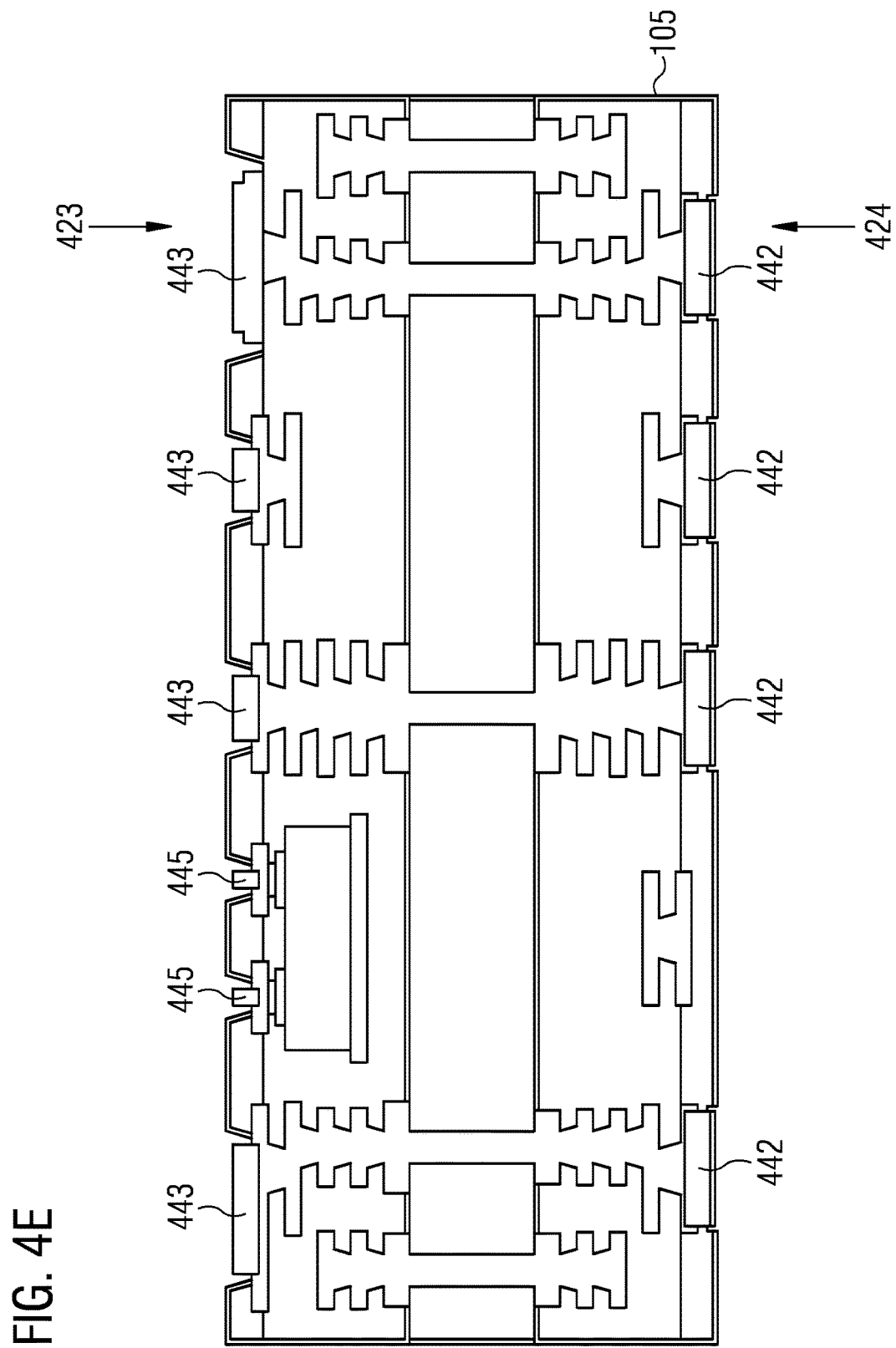

As shown in FIG. 4E, the method may include removing the protection layer 441 after the roughening process. After removing the protection layer 441, the method may include depositing an electrically conductive material in the first openings, the second openings and the third openings. The electrically conductive material may form a first intermediate layer 442, 443, 445 on each of the exposed portions of the plurality of substrate interconnects 106. The first intermediate layer may be a nickel-palladium-gold layer, for example. The first intermediate layer 442 may be formed on the exposed portions 431, 432, 433 located at the front side 423 of the substrate structure 105 and on the exposed portions 434 located at the back side 424 of the substrate structure 105. The first intermediate layer 442, 443, 445 may be formed by forming an electroless a surface finish (NiPdAu) on the first level interconnect FLI pads (located at the front side 423) and the second level interconnect pads (located at the back side 424).

Figure 4F:
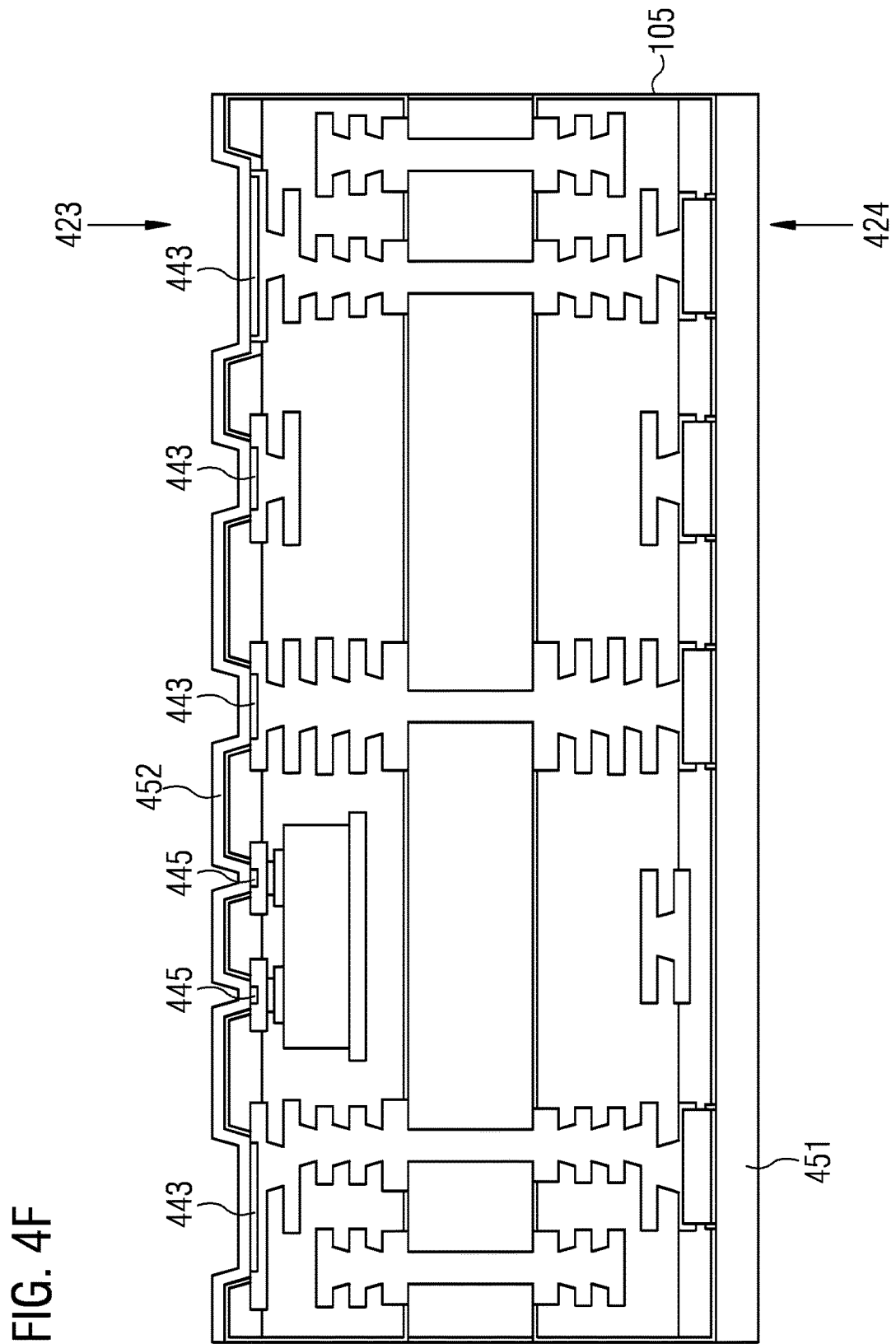

As shown in FIG. 4F, the method may further include forming a protection layer 451 on the back side 424 of the substrate structure 105 after forming the first intermediate layer 442, 443, 445. The protection layer 451 may cover (e.g. all) of the back side 424 (e.g. the second level interconnect side) of the substrate structure 105. The method may further include forming a continuous second intermediate layer 452 on the front side 423 (first level interconnect side) of the substrate structure 105 after forming the protection layer 451. Forming the second intermediate layer 452 may include using electroless deposition to form the second intermediate layer. The second intermediate layer 452 may be an electroless copper seed layer, for example. One or more portions of the second intermediate layer 452 may be formed on the first intermediate layer 442, 443, 445 located at the front side 423 of the substrate structure 105.

Figure 4G:
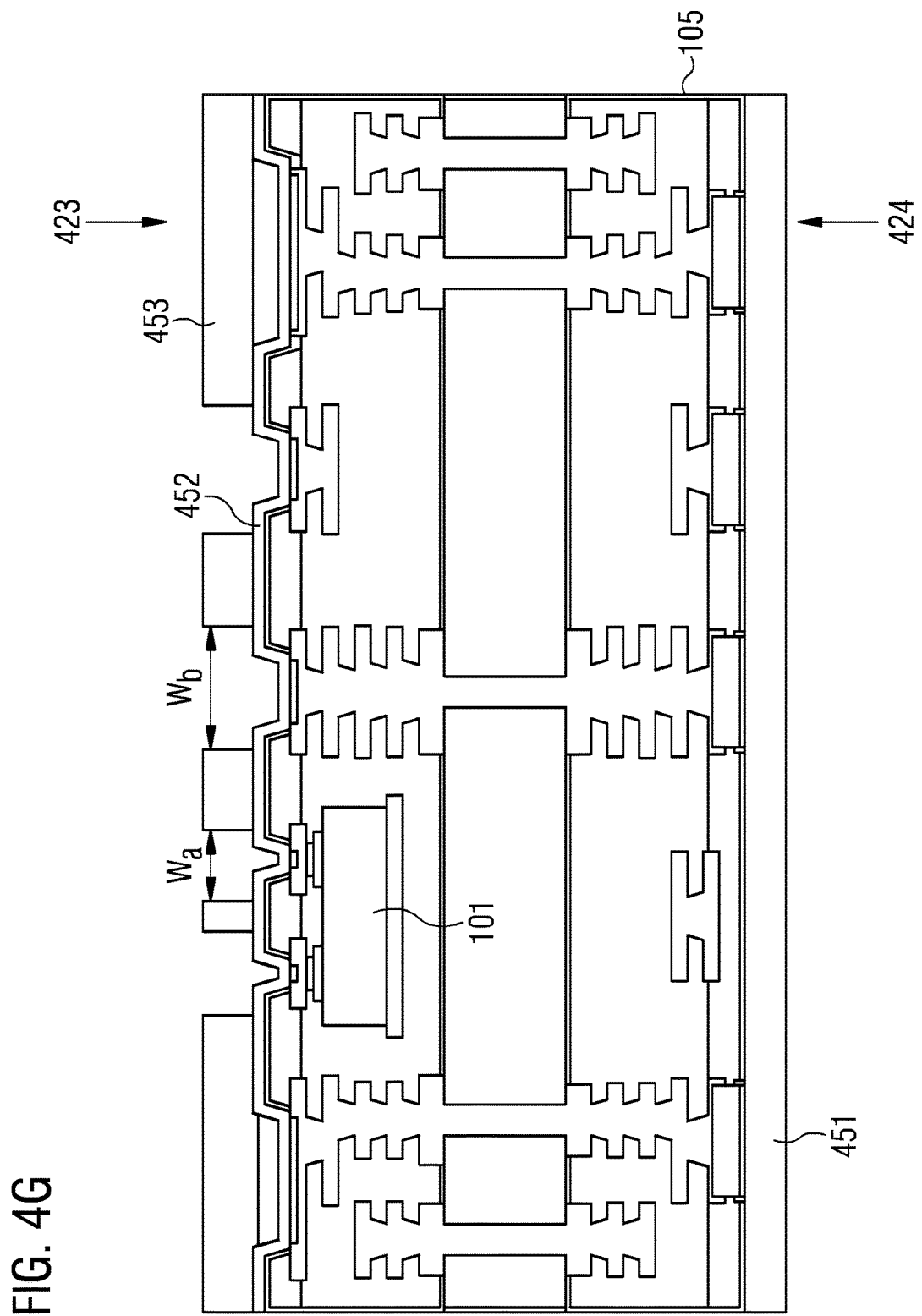

As shown in FIG. 4G, the method may include forming a third mask layer 453 to cover the front side 423 of the substrate structure 105 after forming the second intermediate layer 452. Forming the third mask layer 453 may include forming a dry film resist (DFR) lamination layer on the front side 423. The method may further include removing one or more portions of the third mask layer 453 to form openings in the mask layer 453. The openings in the third mask layer 453 may expose portions of the second intermediate layer 452 located above the bridge die pads 103, 104 of the bridge die 101 and portions of the second intermediate layer 452 located above at least one substrate interconnect 106. For example the mask layer 453 may be patterned to expose the first level interconnect pads, but keeping the DSC and HFI pads protected by the DFR layer.

A maximal lateral dimension (e.g. a width), Wa, of the exposed portions of the second intermediate layer 452 located above the bridge die pads 103, 104 may be smaller than a maximal lateral dimension (e.g. a width), Wb, of the exposed portions of the second intermediate layer 452 located above at least one substrate interconnect 106. As shown in the side view illustration of FIG. 4G, a maximal lateral dimension of each exposed portions, Wb, of the second intermediate layer 452 located above at least one substrate interconnect 106 may be at least 1.5 times (or e.g. 2 times, or e.g. 3 times) a maximal lateral dimension of the of the exposed portions, Wa, of the second intermediate layer 452 located above the bridge die pads 103, 104.

Figure 4H:
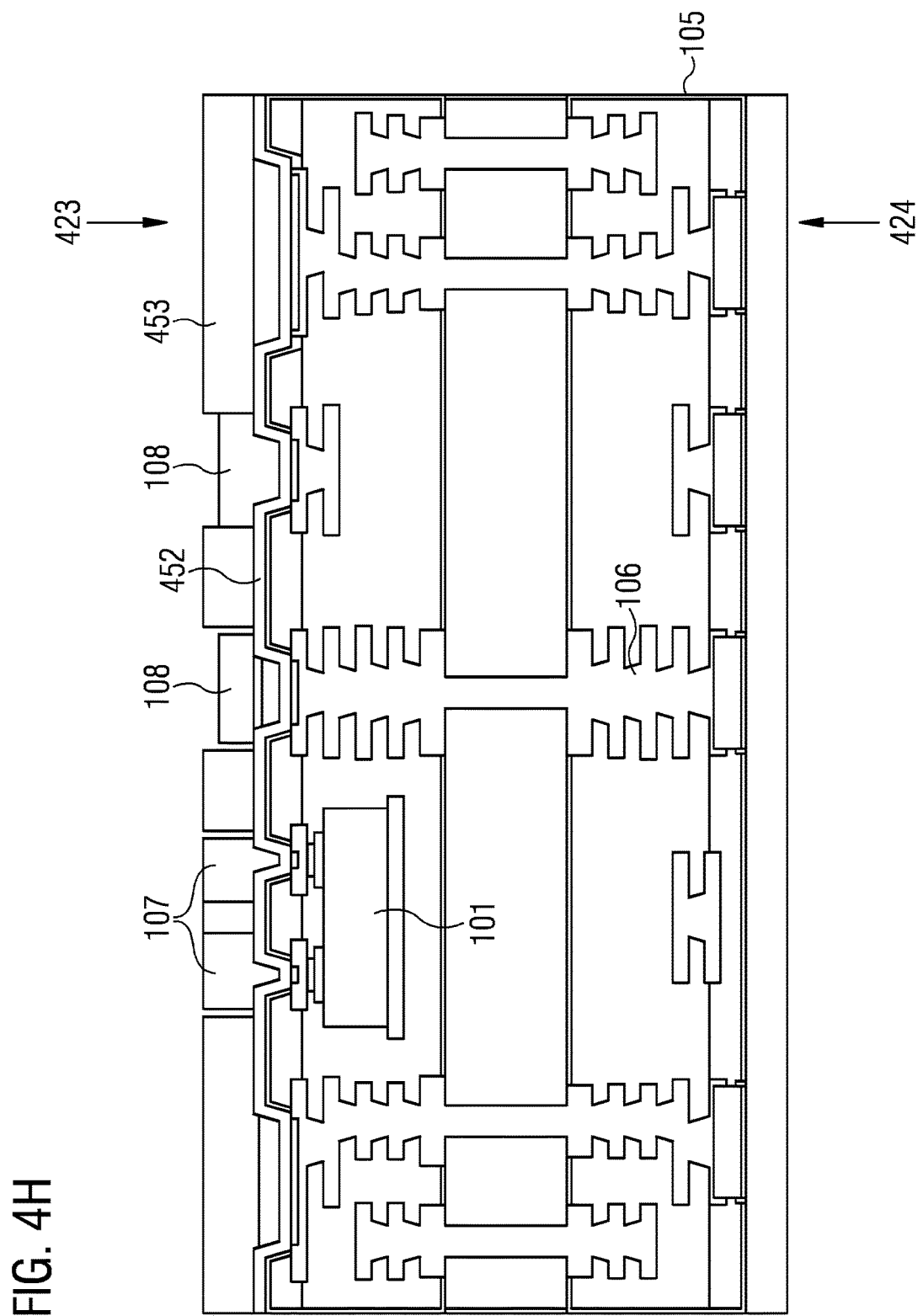

As shown in FIG. 4H, the method may include simultaneously forming at least one first interface structure 107 and at least one second interface structure 108 after forming the openings in the third mask layer 453. Forming the at least one first interface structure 107 and the at least one second interface structure 108 may include electroplating copper bumps in the small resist openings in the DFR lamination layer. The location at which the copper bumps may be selected depending on the architecture. For example, the first interface structure 107 may be connected to the first bridge die pad, and the second interface structure may be connected to the substrate interconnect 106. Due to the difference in widths of the openings in which the copper bumps are formed, the height of the at least one first interface structure 107 may be different from the at least one second interface structure 108. Thus, a BTV or larger than 10 μm (or e.g. larger than 15 μm, or e.g. larger than 20 μm) may exist between the at least one first interface structure 107 and the at least one second interface structure 108.

Figure 4I:
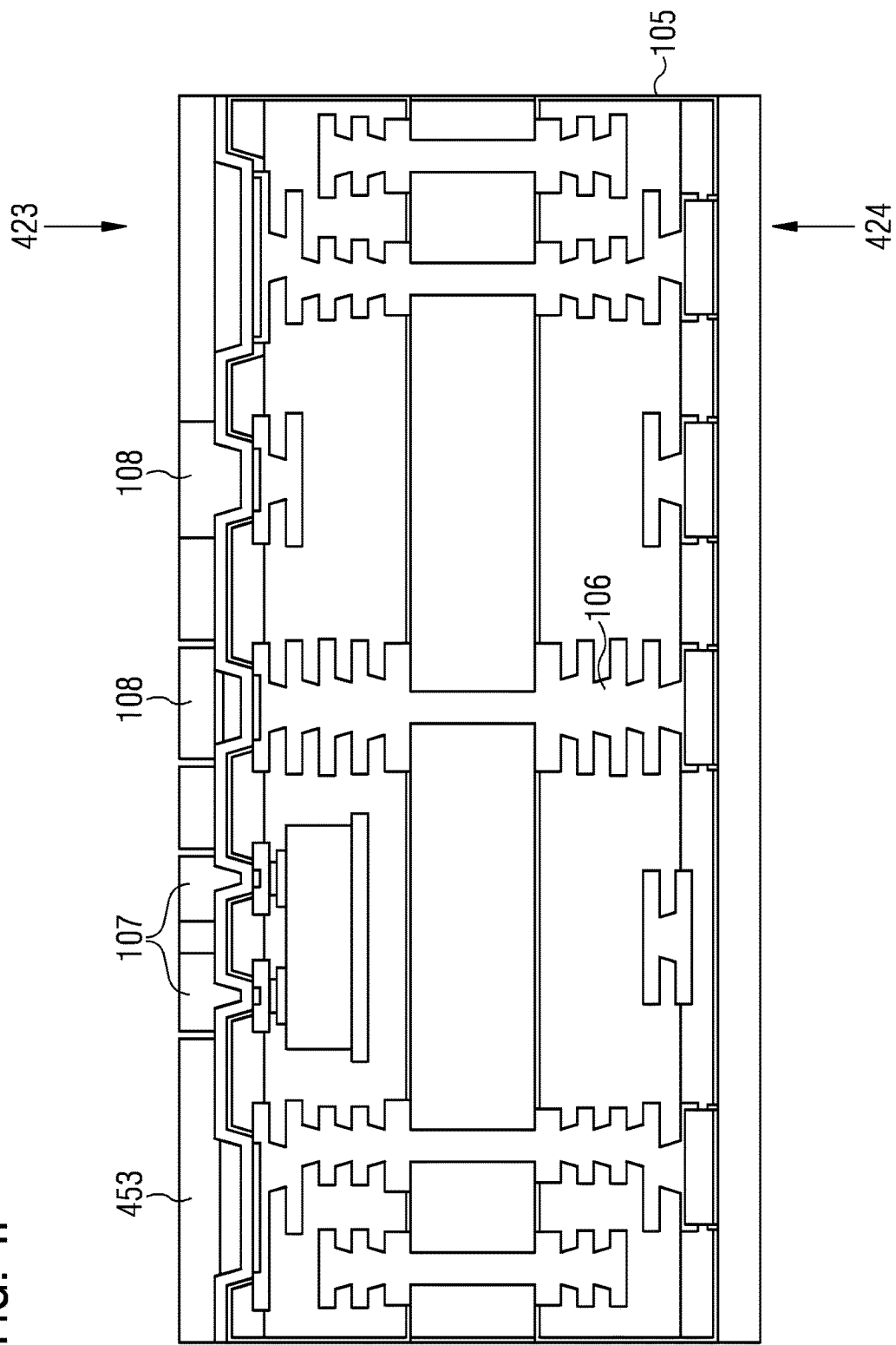

As shown in FIG. 4I, the method may include planarizing a surface (at the front side 423 of the substrate structure 105) until a vertical distance between a surface of the first interface structure 107 and a surface of the second interface structure 108 is less than 10 μm (or e.g. less than 8 μm or e.g. less than 4 μm. For example, portions of the mask layer 453 remaining at the front side 423 of the substrate structure 105, and at least one of the first interface structure 107 and second interface structure 108 may be planarized (e.g. by chemical mechanical polishing) until their lateral surfaces are substantially level (e.g. until their surfaces are at the same height). The polishing of the DFR layer and the copper interface structures may lead to the bump surfaces and the DFR being flush (or level) with each other.

Figure 4J:
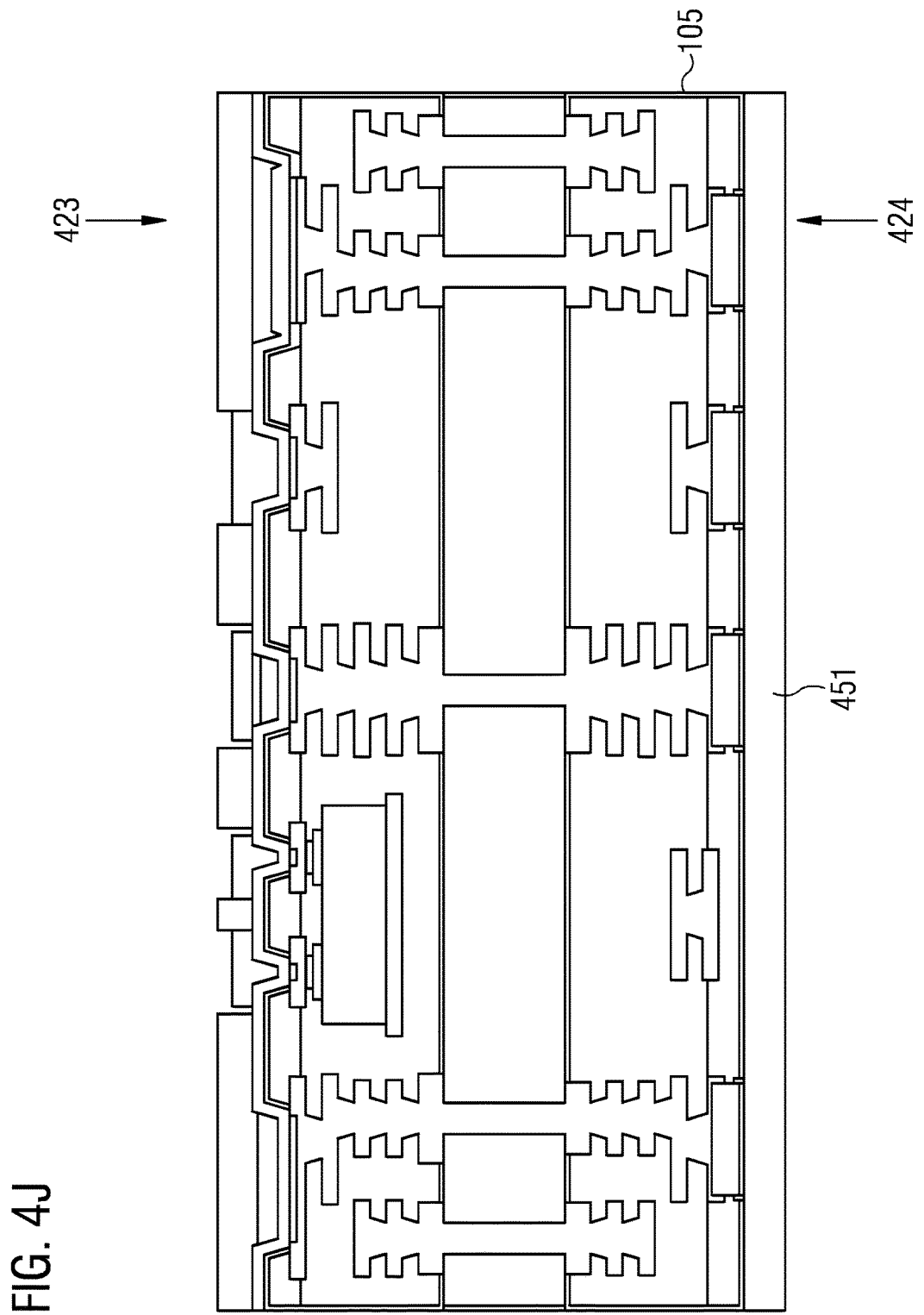

As shown in FIG. 4J, the method may include simultaneously removing (e.g. by etching) at least part of the first interface structure 107 and the second interface structure 108 after planarizing the surface. Between 10% and 20% (e.g. between 5 μm and 10 5 μm) of the first interface structure 107 and the second interface structure 108 may be removed, for example. The etchant may be selected so that during the etching, the etch rate of the first interface structure 107 and the second interface structure 108 may be at least 100 times higher than an etch rate of the mask layer 453.

Figure 4K:
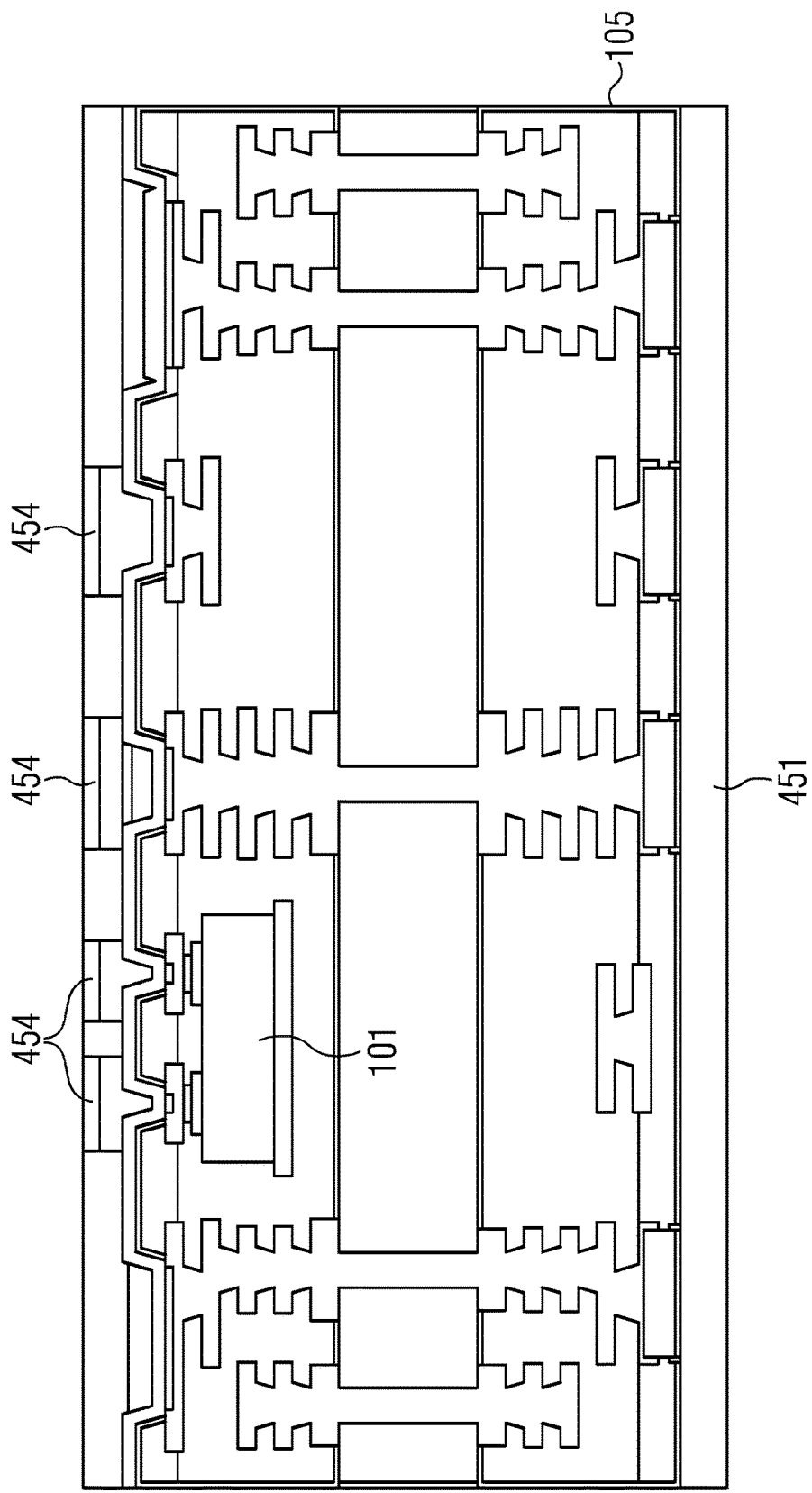

As shown in FIG. 4K, the method may further include forming a surface finish layer 454 (e.g. by electroplating) on the remaining first interface structure 107 and the second interface structure 108 after removing least part of the first interface structure 107 and the second interface structure 108. The surface finish layer may be an electrolytic nickel-palladium-gold layer, for example.

Figure 4L:
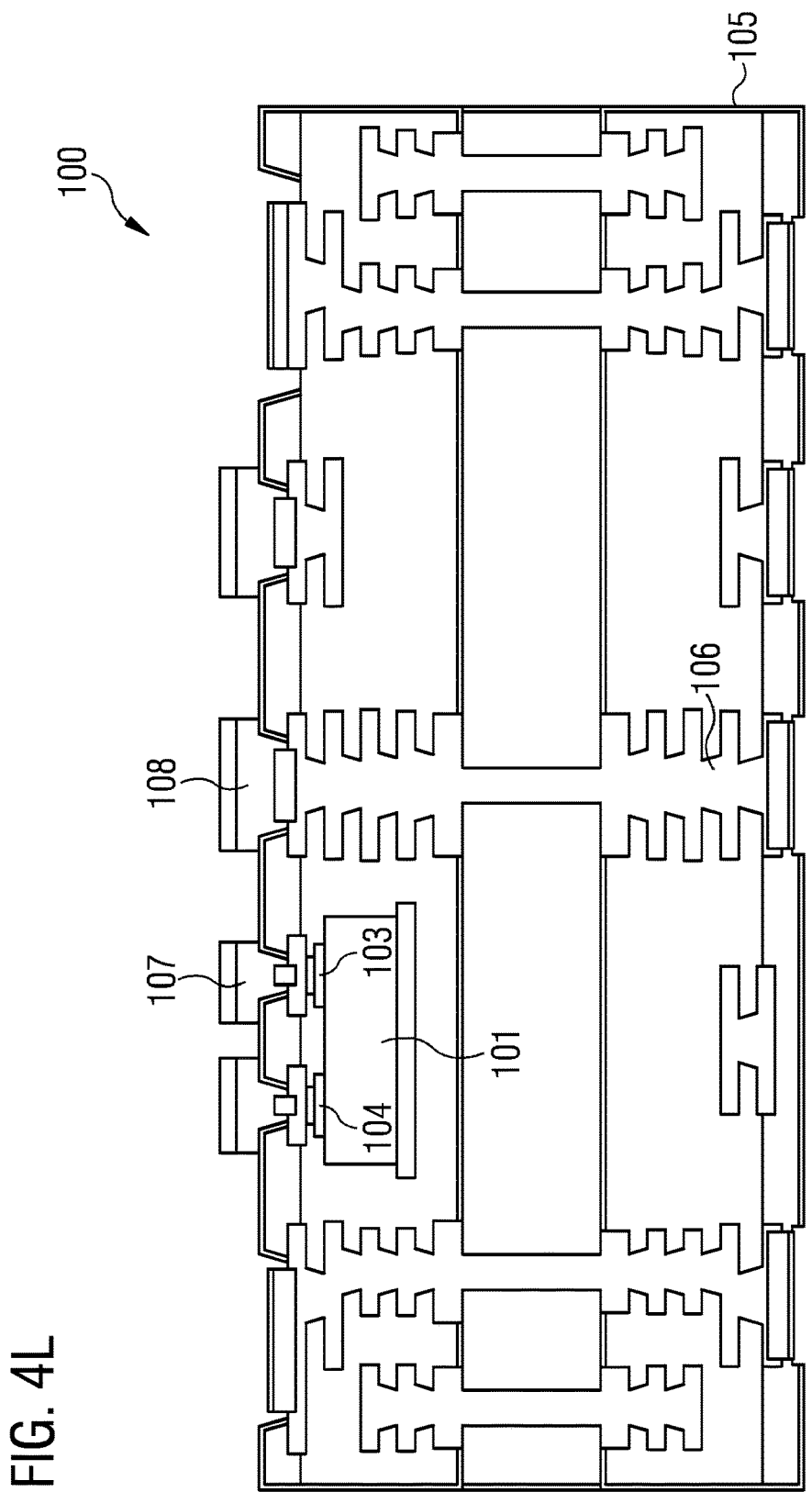

As shown in FIG. 4L, the method may further include removing the protection layer 451 and removing portions of the second intermediate layer (e.g. the copper seed layer) exposed by the removal of the protection layer 451 after forming the surface layer 454. The protection layer 451 may be removed by performing a DFR strip, for example. The portions of the second intermediate layer may be removed by etching, for example.

FIG. 4L shows a die interconnect substrate (e.g. a die interconnect substrate 100) which may be ready to be attached to a semiconductor die. The method may further include attaching a semiconductor die to at least one of the first interface structure 107 and the second interface structure 108. Optionally, the same semiconductor die may be attached to the first interface structure 107 and the second interface structure 108.

As shown in FIG. 4L, the die interconnect substrate 100 may include the bridge die 101, which may include at least one bridge interconnect connecting a first bridge die pad 103 of the bridge die 101 to a second bridge die pad 104 of the bridge die 101. The die interconnect substrate 100 may further include the substrate structure 105, which may include at least one the substrate interconnect 106 electrically insulated from the bridge die 101. The bridge die 101 may be embedded in the substrate structure 105. The die interconnect substrate 100 may further include the first interface structure 107 for attaching a semiconductor die to the substrate structure 105. The first interface structure 107 may be connected to the first bridge die pad 103. The die interconnect substrate 100 may further include the second interface structure 108 for attaching a semiconductor die to the substrate structure 105. The second interface structure 108 may be connected to the substrate interconnect 106.

A vertical distance between a surface 109 of the first interface structure 107 and a surface 111 of the second interface structure 108 may be less than 10 µm (or e.g. less than 8 µm or e.g. less than 4 µm. Additionally or optionally, a tilt (or gradient or slope) of the lateral surface 109 of the first interface structure 107 may vary by less than 5° (or e.g. less than 3°, or e.g. less than) 1° over at least 80% (or e.g. at least 85%, or e.g. at least 95%) of the lateral surface 109 of the first interface structure 107 (see FIG. 5A).

The various examples described herein relate to EMIB FLI architecture in which Cu—NiPdAu bumps may be electrodeposited. Due to dual bump pitch (BP) on the substrates, the electroplating of Cu may have different plating rates in each bump pitch which may result in small BP being plated thicker by 2 to 3 µm compared to large BP areas. The gap in the plated Cu height impacts the BTV directly of the substrates. The architecture cap of NiPdAu on Cu may make it challenging to be polished (or CMP) due to the risk of polishing the NiPdAu cap entirely. The examples describe a process flow on achieving improved BTV with polishing without damaging the NiPdAu cap layer.

The various examples may include plating Cu with DFR and then polishing the Cu and DFR such that the Cu and DFR are flushed. After this, Cu may be chemically etched up to 5 µm and then plated NiPdAu with the DFR on.

More details and aspects are mentioned in connection with the examples described above or below. The examples shown in FIGS. 4A to 4L may each comprise one or more optional additional features corresponding to one or more aspects mentioned in connection with the proposed concept or one or more examples described above (e.g. FIGS. 1 to 3) or below (FIGS. 5A to 6).

Figure 5A:
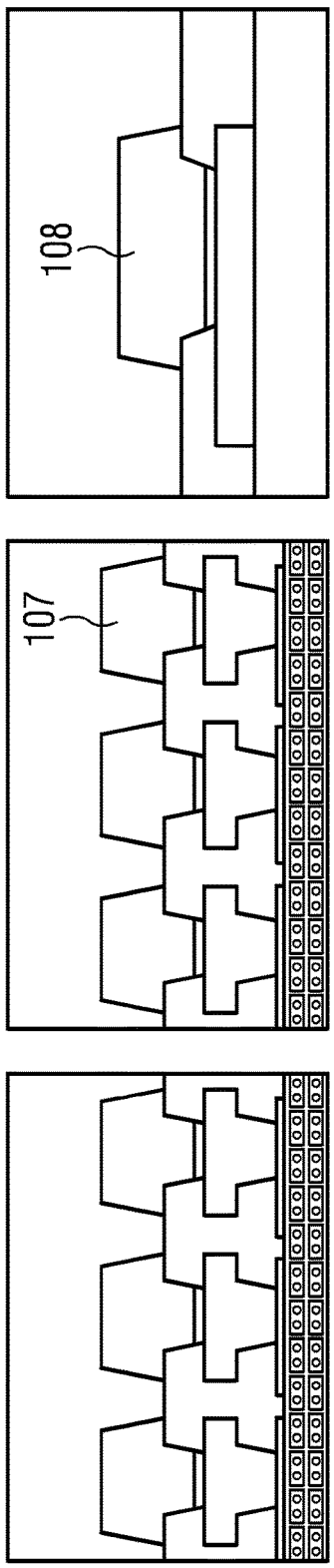
FIG. 5A shows images of planarized interface structures.

FIG. 5A shows a schematic illustration of at least one first interface structure 107 and at least one second interface structure 108 after chemical mechanical polishing. As shown in FIG. 5A, the lateral surface of the first interface structure 107 and the lateral surface of the second interface structure 108 may be level with each other and substantially flat over more at least 80% of the lateral surface 109 of the first interface structure 107.

Figure 5B:
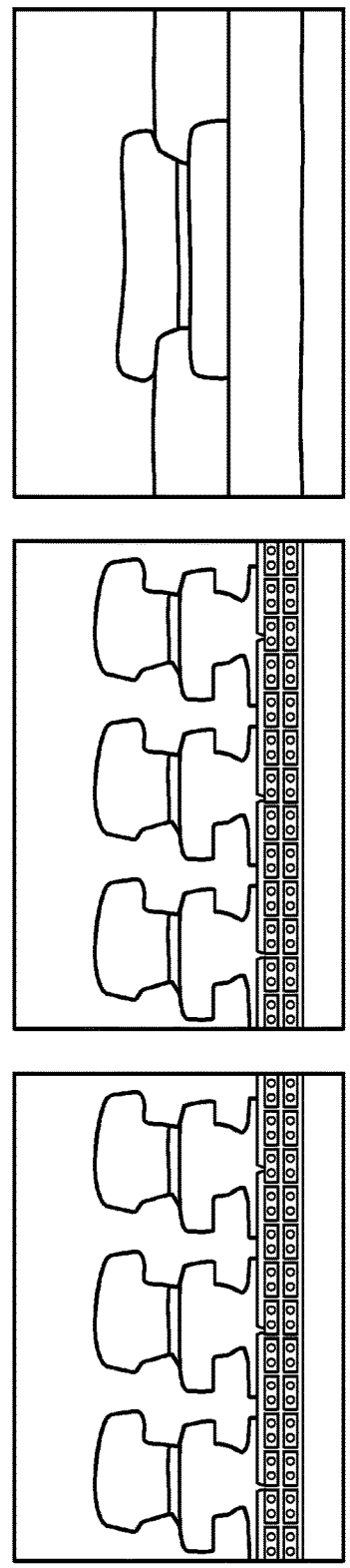
FIG. 5B shows images of non-planarized interface structures.

FIG. 5B shows a schematic illustration of at least one first interface structure 107 and at least one second interface structure 108 without planarization.

The first interface structure 107 and the second interface structure 108 of FIG. 5A differ from those of FIG. 5B (without chemical mechanical polishing) as the bumps shown in FIG. 5B have a curved lateral surface, and a larger BTV which may lead to faulty connections to the semiconductor die.

In the examples described herein, even if there are different (multiple) bump pitches, and the plated architecture is Cu—NiPdAu (which may have dissolved in the solder), the height of the Cu bumps in the areas with different bump pitches may be similar and/or the same (e.g. the lateral surfaces of the Cu bumps may be level within the error limits of planarization processes). Additionally, the bump shape of the first interface structure may lack protrusions on the small SRO bumps. For example, due to the flatness of the lateral surfaces of the first interface structures and the second interface structures, the bumps/protrusions may disappear or be minimized) and the bump top may be flat.

More details and aspects are mentioned in connection with the examples described above or below. The examples shown in FIGS. 5A to 5B may each comprise one or more optional additional features corresponding to one or more aspects mentioned in connection with the proposed concept or one or more examples described above (e.g. FIGS. 1 to 4L) or below (FIGS. 5A to 6).

FIG. 6 shows a schematic illustration a semiconductor device. The semiconductor device comprises a die interconnect substrate 100, 200.

The die interconnect substrate 100, 200 comprises a bridge die 101 comprising at least one bridge interconnect 102 connecting a first bridge die pad 103 of the bridge die 101 to a second bridge die pad 104 of the bridge die 101.

The semiconductor device 600 comprises a first semiconductor die connected to the first bridge die pad 103. The semiconductor device 600 comprises a second semiconductor die 113 connected to the second bridge die pad 104.

The die interconnect substrate 100, 200 further comprises a substrate structure 105 comprising a substrate interconnect 106 electrically insulated from the bridge die 101. The bridge die 101 is embedded in the substrate structure 105.

The die interconnect substrate 100, 200 further comprises a first interface structure 107 for attaching the first semiconductor die 112 to the substrate structure 105. The first interface structure 107 is connected to the first bridge die pad 103.

The die interconnect substrate 100, 200 further comprises a second interface structure 108 for attaching the second semiconductor die 113 to the substrate structure 105. The second interface structure 108 is connected to the substrate interconnect 106.

A surface 109 of the first interface structure 107 and a surface 111 of the second interface structure 108 is at the same height.

Due to the surface 109 of the first interface structure 107 and the surface 111 of the second interface structure 108 being at the same height, connections to the die interconnect substrate 100, 200 (e.g. a connection between a semiconductor die and the die interconnect substrate 100, 200) may be made more reliably. For example, faulty connections caused by bump top variations, BTV, (or e.g. a variation in bump height, or e.g. a variation in the height of the first interface structure 107 and the second interface structure 108) may be reduced.

The first bridge die pad 103 may be ohmically or electrically connected to the first semiconductor die 112 via the first contact interface structure 107. Additionally, the second bridge die pad 104 may be ohmically or electrically connected to the second semiconductor die 113 via another contact interface structure.

More details and aspects are mentioned in connection with the examples described above or below. The examples shown in FIG. 6 may comprise one or more optional additional features corresponding to one or more aspects mentioned in connection with the proposed concept or one or more examples described above (e.g. FIGS. 1 to 5B) or below.

Various examples relate to Cu chemical mechanical polishing CMP on Cu—NiPdAu FLI architecture for BTV improvement, Cu FLIP and/or plated bumps.

The aspects and features (e.g. the die interconnect substrate, the bridge die, the at least one bridge interconnect, the first bridge die pad, the second bridge de bad, the substrate structure, the substrate interconnect, the first interface structure, the semiconductor die, the second interface structure, the surface finish layer, the bridge contact structure, the contact portion of the substrate interconnect, the third interface structure and the fourth interface structure) mentioned and described together with one or more of the previously detailed examples and figures, may as well be combined with one or more of the other examples in order to replace a like feature of the other example or in order to additionally introduce the feature to the other example.

There is a demand to provide semiconductor devices which are reliable and/or which are less susceptible to faults.

In the following, examples pertain to further examples.

Example 1 is a die interconnect substrate, comprising: a bridge die comprising at least one bridge interconnect connecting a first bridge die pad of the bridge die to a second bridge die pad of the bridge die; a substrate structure comprising a substrate interconnect electrically insulated from the bridge die, wherein the bridge die is embedded in the substrate structure; a first interface structure for attaching a semiconductor die to the substrate structure, wherein the first interface structure is connected to the first bridge die pad; and a second interface structure for attaching a semiconductor die to the substrate structure, wherein the second interface structure is connected to the substrate interconnect, wherein a surface of the first interface structure and a surface of the second interface structure are at the same height.

In example 2, the subject matter of example 1 can optionally include a vertical distance between the surface of the first interface structure and the surface of the second interface structure being less than 10 µm.

In example 3, the subject matter of example 1 or 2 can optionally include a maximal lateral dimension of the second interface structure being at least 1.5 times a maximal lateral dimension of the first interface structure.

In example 4, the subject matter of any of examples 1 to 3 can optionally include a maximal lateral dimension of the first interface structure being less than 30 µm.

In example 5, the subject matter of any of examples 1 to 4 can optionally include a maximal lateral dimension of the second interface structure lying between 50 µm and 150 µm.

In example 6, the subject matter of any of examples 1 to 5 can optionally include a plurality of first interface structures and a plurality of second interface structures, wherein a minimal distance between adjacent interface structures of the plurality of first interface structures is less than 0.7 times a minimal distance between adjacent interface structures of the plurality of second interface structures.

In example 7, the subject matter of example 6 can optionally include a minimal distance between adjacent interface structures of the plurality of first interface structures being less than 60 µm.

In example 8, the subject matter of example 6 or 7 can optionally include a minimal distance between adjacent interface structures of the plurality of second interface structures being larger than 60 µm.

In example 9, the subject matter of any of examples 1 to 8 can optionally include a distance between the surface of the first interface structure and a surface of the first bridge die pad lying between 10 µm and 30 µm.

In example 10, the subject matter of any of examples 1 to 9 can optionally include the first interface structure and the second interface structure being configured for attaching a semiconductor die to the substrate structure via a controlled collapse chip connection.

In example 11, the subject matter of any of examples 1 to 10 can optionally include the bridge die comprising a substrate die, wherein the bridge interconnect is formed on the substrate die.

In example 12, the subject matter of example 11 can optionally include the substrate die being a glass die or a silicon die.

In example 13, the subject matter of any of examples 1 to 12 can optionally further include a surface finish layer located at the surface of the first interface structure and at the surface of the second interface structure.

In example 14, the subject matter of any of examples 1 to 13 can optionally include a thickness of the substrate structure being at least 700 µm.

In example 15, the subject matter of any of examples 1 to 14 can optionally include a bridge contact structure located between the first bridge die pad and the first interface structure, and wherein the substrate interconnect comprises a contact portion, wherein the contact portion of the substrate interconnect and the bridge contact structure are located at the same wiring layer of the substrate structure.

In example 16, the subject matter of example 15 can optionally further include the bridge contact structure and the contact portion of the substrate interconnect each comprising a first intermediate layer and a second intermediate layer formed on the first intermediate layer.

In example 17, the subject matter of example 16 can optionally include the first intermediate layer being a nickel-palladium-gold layer and the second intermediate layer being a copper layer.

In example 18, the subject matter of any of examples 1 to 17 can optionally include the first interface structure and the second interface structure being located at a front side of the substrate structure.

In example 19, the subject matter of any of examples 1 to 18 can optionally further include a plurality of third interface structures for attaching the substrate structure to a carrier, wherein the plurality of third interface structures are located at a back side of the substrate structure.

In example 20, the subject matter of example 19 can optionally include the substrate interconnect being further connected to a third interface structure.

In example 21, the subject matter of any of examples 1 to 20 can optionally further include at least one fourth interface structure for attaching a passive component to the substrate structure.

Example 22 is a die interconnect substrate, comprising: a bridge die comprising at least one bridge interconnect connecting a first bridge die pad of the bridge die to a second bridge die pad of the bridge die; a substrate structure comprising a substrate interconnect electrically insulated from the bridge die, wherein the bridge die is embedded in the substrate structure; a first interface structure for attaching a semiconductor die to the substrate structure, wherein the first interface structure is connected to the first bridge die pad; and a second interface structure for attaching a semiconductor die to the substrate structure, wherein the second interface structure is connected to the substrate interconnect, wherein a tilt of a lateral surface of the first interface structure varies by less than 5° over at least 80% of the lateral surface of the first interface structure.

In example 23, the subject matter of example 22 can optionally include a maximal lateral dimension of the second interface structure being at least 1.5 times a maximal lateral dimension of the first interface structure.

Example 24 is a semiconductor device, comprising: a die interconnect substrate according to any of examples 1 to 23;

a first semiconductor die connected to the first bridge die pad; and a second semiconductor die connected to the second bridge die pad.

In example 25, the subject matter of example 24 can optionally include a plurality of first interface structures and a plurality of second interface structures, wherein a minimal distance between adjacent interface structures of the plurality of first interface structures is less than 0.7 times a minimal distance between adjacent interface structures of the plurality of second interface structures.

In example 26, the subject matter of example 24 or 25 can optionally include a maximal lateral dimension of the second interface structure being at least 1.5 times a maximal lateral dimension of the first interface structure.

In example 27, the subject matter of any of examples example 24 to 26 can optionally include a vertical distance between the surface of the first interface structure and the surface of the second interface structure being less than 10 µm.

Example 28 is a method for forming a die interconnect substrate, the method comprising: embedding a bridge die in a substrate structure, wherein the bridge die comprises at least one bridge interconnect connecting a first bridge die pad of the bridge die to a second bridge die pad of the bridge die, wherein the substrate structure comprising a substrate interconnect electrically insulated from the bridge die; simultaneously forming a first interface structure and a second interface structure, wherein the first interface structure is connected to the first bridge die pad, and wherein the second interface structure is connected to the substrate interconnect; and planarizing a surface until a surface of the first interface structure and a surface of the second interface structure are at the same height.

In example 29, the subject matter of example 28 can optionally further include simultaneously removing at least part of the first interface structure and the second interface structure after planarizing the surface, and forming a surface finish layer on the remaining first interface structure and the second interface structure.

In example 30, the subject matter of example 28 or 29 can optionally further include attaching a semiconductor die to at least one of the first interface structure and the second interface structure In example 31, the subject matter of any of examples 28 to 30 can optionally include, the surface being planarized until a vertical distance between the surface of the first interface structure and the surface of the second interface structure is less than 10 µm.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A die interconnect substrate, comprising:
    a bridge die comprising at least one bridge interconnect connecting a first bridge die pad of the bridge die to a second bridge die pad of the bridge die;
    a substrate structure comprising a plurality of substrate interconnects electrically insulated from the bridge die, wherein the bridge die is embedded in the substrate structure;
    a plurality of first interface structures for attaching a semiconductor die to the substrate structure, wherein the first interface structures are connected to bridge die pads of the bridge die,
    a plurality of second interface structures for attaching a semiconductor die to the substrate structure, wherein the second interface structures are connected to substrate interconnects of the plurality of substrate interconnects, and
    a surface finish layer located at the surface of the first interface structure and the surface of the second interface structure for attaching a semiconductor die to the first or second interface structures, wherein the surface finish layer covers an entire top surface of the first interface structure and the second interface structure;
    wherein the first interface structures and the second interface structures comprise copper,
    wherein a surface of the plurality of first interface structures and a surface of the plurality of second interface structures are at the same height; and
    wherein a minimal distance between adjacent interface structures of the plurality of first interface structures is less than a minimal distance between adjacent interface structures of the plurality of second interface structures.

2. The die interconnect substrate according to claim 1, wherein a vertical distance between the surface of the first interface structure and the surface of the second interface structure is less than 10 µm.

3. The die interconnect substrate according to claim 1, wherein a maximal lateral dimension of the second interface structure is at least 1.5 times a maximal lateral dimension of the first interface structure.

4. The die interconnect substrate according to claim 1, wherein a maximal lateral dimension of the first interface structure is less than 30 µm.

5. The die interconnect substrate according to claim 1, wherein a maximal lateral dimension of the second interface structure lies between 50 µm and 150 µm.

6. The die interconnect substrate according to claim 1, wherein the minimal distance between adjacent interface structures of the plurality of first interface structures is less than 0.7 times the minimal distance between adjacent interface structures of the plurality of second interface structures.

7. The die interconnect substrate according to claim 6, wherein a minimal distance between adjacent interface structures of the plurality of first interface structures is less than 60 µm.

8. The die interconnect substrate according to claim 6, wherein a minimal distance between adjacent interface structures of the plurality of second interface structures is larger than 60 µm.

9. The die interconnect substrate according to claim 1, wherein a distance between the surface of the first interface structure and a surface of the first bridge die pad lies between 10 µm and 30 µm.

10. The die interconnect substrate according to claim 1, wherein the first interface structure and the second interface structure are configured for attaching a semiconductor die to the substrate structure via a controlled collapse chip connection.

11. The die interconnect substrate according to claim 1, wherein the bridge die comprises a substrate die, wherein the bridge interconnect is formed on the substrate die.

12. The die interconnect substrate according to claim 11, wherein the substrate die is a glass die or a silicon die.

13. The die interconnect substrate according to claim 1, wherein a thickness of the substrate structure is at least 700 µm.

14. The die interconnect substrate according to claim 1, further comprising a bridge contact structure located between the first bridge die pad and the first interface structure, and wherein the substrate interconnect comprises a contact portion, wherein the contact portion of the substrate interconnect and the bridge contact structure are located at the same wiring layer of the substrate structure.

15. The die interconnect substrate according to claim 14, wherein the bridge contact structure and the contact portion of the substrate interconnect each comprises a first intermediate layer and a second intermediate layer formed on the first intermediate layer.

16. The die interconnect substrate according to claim 15, wherein the first intermediate layer is a nickel-palladium-gold layer and wherein the second intermediate layer is a copper layer.

17. The die interconnect substrate according to claim 1, wherein the first interface structure and the second interface structure are located at a front side of the substrate structure.

18. A die interconnect substrate, comprising:
a bridge die comprising at least one bridge interconnect connecting a first bridge die pad of the bridge die to a second bridge die pad of the bridge die;
a substrate structure comprising a plurality of substrate interconnects electrically insulated from the bridge die, wherein the bridge die is embedded in the substrate structure;
a plurality of first interface structures for attaching a semiconductor die to the substrate structure, wherein the first interface structures are connected to bridge die pads of the bridge die,
a plurality of second interface structures for attaching a semiconductor die to the substrate structure, wherein the second interface structures are connected to substrate interconnects of the plurality of substrate interconnects, and
a surface finish layer located at the surface of the first interface structure and at the surface of the second interface structure for attaching a semiconductor die to the first or second interface structures, wherein the surface finish layer covers an entire top surface of the first interface structure and the second interface structure;
wherein the first interface structures and the second interface structures comprise copper,
wherein a tilt of a lateral surface of the first interface structure varies by less than 5° over at least 80% of the lateral surface of the first interface structure, and
wherein a minimal distance between adjacent interface structures of the plurality of first interface structures is less than a minimal distance between adjacent interface structures of the plurality of second interface structures.

19. The die interconnect substrate according to claim 18, wherein a maximal lateral dimension of the second interface structure is at least 1.5 times a maximal lateral dimension of the first interface structure.

20. A semiconductor device, comprising:
a die interconnect substrate, comprising a bridge die comprising at least one bridge interconnect connecting a first bridge die pad of the bridge die to a second bridge die pad of the bridge die;
a first semiconductor die connected to the first bridge die pad; and
a second semiconductor die connected to the second bridge die pad,
wherein the die interconnect substrate comprises a substrate structure comprising a plurality of substrate interconnects electrically insulated from the bridge die, wherein the bridge die is embedded in the substrate structure,
wherein the die interconnect substrate comprises a plurality of first interface structures for attaching a semiconductor die to the substrate structure, wherein the first interface structures are connected to the bridge die pads of the bridge die, wherein at least one first interface structure of the plurality of first interface structures is connected to the first semiconductor die and at least one first interface structure of the plurality of first interface structures is connected to the second semiconductor die,
wherein the die interconnect substrate comprises a plurality of second interface structures for attaching a semiconductor die to the substrate structure, wherein the second interface structures are connected to substrate interconnects of the plurality of substrate interconnects, wherein at least one second interface structure of the plurality of second interface structures is connected to the first semiconductor die and at least one second interface structure of the plurality of second interface structures is connected to the second semiconductor die,
wherein the die interconnect substrate comprises a surface finish layer located at the surface of the first interface structure and at the surface of the second interface structure for attaching a semiconductor die to the first or second interface structures, wherein the surface finish layer covers an entire top surface of the first interface structure and the second interface structure;

wherein the first interface structures and the second interface structures comprise copper, wherein a surface of the first interface structure and a surface of the second interface structure are at the same height, and wherein a minimal distance between adjacent interface structures of the plurality of first interface structures is less than a minimal distance between adjacent interface structures of the plurality of second interface structures.

21. The die interconnect substrate according claim 20, comprising a plurality of first interface structures and a plurality of second interface structures, wherein a minimal distance between adjacent interface structures of the plurality of first interface structures is less than 0.7 times a minimal distance between adjacent interface structures of the plurality of second interface structures.

22. A die interconnect substrate, comprising:
a bridge die comprising at least one bridge interconnect connecting a first bridge die pad of the bridge die to a second bridge die pad of the bridge die;
a substrate structure comprising a plurality of substrate interconnects electrically insulated from the bridge die, wherein the bridge die is embedded in the substrate structure;
a plurality of first interface structures for attaching a semiconductor die to the substrate structure, wherein the first interface structures are connected to bridge die pads of the bridge die,
a plurality of second interface structures for attaching a semiconductor die to the substrate structure, wherein the second interface structures are connected to substrate interconnects of the plurality of substrate interconnects, and
a surface finish layer located at the surface of the first interface structure and the surface of the second interface structure for attaching a semiconductor die to the first or second interface structures;
wherein the first interface structures and the second interface structures comprise copper,
wherein a surface of the plurality of first interface structures and a surface of the plurality of second interface structures are at the same height;
wherein a minimal distance between adjacent interface structures of the plurality of first interface structures is less than a minimal distance between adjacent interface structures of the plurality of second interface structures; and
a bridge contact structure located between the first bridge die pad and the first interface structure, and wherein the substrate interconnect comprises a contact portion, wherein the contact portion of the substrate interconnect and the bridge contact structure are located at the same wiring layer of the substrate structure, wherein the bridge contact structure and the contact portion of the substrate interconnect each comprises a first intermediate layer and a second intermediate layer formed on the first intermediate layer, and wherein the first intermediate layer is a nickel-palladium-gold layer and wherein the second intermediate layer is a copper layer.

* * * * *